United States Patent [19]
Bazarjani et al.

[11] Patent Number: 5,982,315
[45] Date of Patent: Nov. 9, 1999

[54] MULTI-LOOP Σ Δ ANALOG TO DIGITAL CONVERTER

[75] Inventors: Seyfollah S. Bazarjani; Saed G. Younis, both of San Diego, Calif.

[73] Assignee: QUALCOMM Incorporated, San Diego, Calif.

[21] Appl. No.: 08/928,874

[22] Filed: Sep. 12, 1997

[51] Int. Cl.$^6$ .................................................. H03M 3/00
[52] U.S. Cl. ............................................................ 341/143
[58] Field of Search ............................................ 341/143

[56] References Cited

U.S. PATENT DOCUMENTS

| | | | |
|---|---|---|---|
| 4,857,938 | 8/1989 | Gailus et al. | 341/143 |
| 5,001,725 | 3/1991 | Senderowicz et al. | 341/143 |
| 5,283,578 | 2/1994 | Ribner et al. | 341/143 |
| 5,311,181 | 5/1994 | Ferguson, Jr. et al. | 341/143 |
| 5,345,406 | 9/1994 | Williams | 364/724 |
| 5,430,890 | 7/1995 | Vogt et al. | 455/180.3 |
| 5,432,779 | 7/1995 | Shimo et al. | 370/30 |
| 5,477,481 | 12/1995 | Kerth | 364/825 |
| 5,500,645 | 3/1996 | Ribner et al. | 341/143 |
| 5,517,689 | 5/1996 | Hayashihara | 455/205 |
| 5,550,869 | 8/1996 | Gurantz et al. | 375/340 |
| 5,557,642 | 9/1996 | Williams | 375/316 |
| 5,568,144 | 10/1996 | Chiao et al. | 341/139 |
| 5,574,457 | 11/1996 | Garrity et al. | 341/172 |
| 5,590,411 | 12/1996 | Sroka et al. | 455/78 |
| 5,621,345 | 4/1997 | Lee et al. | 327/254 |
| 5,623,432 | 4/1997 | Degrauwe | 364/707 |
| 5,729,230 | 3/1998 | Jensen et al. | 341/143 |
| 5,734,683 | 3/1998 | Hulko et al. | 375/316 |
| 5,764,171 | 6/1998 | Stikvoort | 341/143 |

FOREIGN PATENT DOCUMENTS

| | | | |
|---|---|---|---|
| 0641085 | 8/1994 | European Pat. Off. | H03M 3/02 |
| 0643477 | 9/1994 | European Pat. Off. | H03D 7/16 |
| 0673125 | 9/1994 | European Pat. Off. | H04B 1/707 |
| 0814568 | 12/1997 | European Pat. Off. | H04B 1/10 |
| 2258122 | 7/1992 | United Kingdom | H04B 1/10 |
| 9307679 | 4/1993 | WIPO | H03M 3/00 |
| 9619048 | 6/1996 | WIPO | H04B 7/005 |
| 9624193 | 8/1996 | WIPO | H03M 1/18 |

OTHER PUBLICATIONS

An 81–MHZ IF Receiver in CMOS, Hairapetian in IEEE Journal of Solid State Circuits vol. 31, No. 12 Dec. 1996, pp. 1981–1986.

"A Novel Double Sampling Technique for Delta–Sigma Modulators" Yang et al., IEEE, Mar. 8, 1994. pp. 1187–1190.

"Low Voltage Double Sampled Delta–Sigma Converters", Senderowicz et al, IEEE Journal on Solid State Circuits, vol. 32, No. 12, Dec. 1997, pp. 1907–1919.

"A Comparison of Modular Networks for High–Order Oversampled Analog-to-Digital Converters" by David B. Ribner; IEEE Transactions on Circuits and Systems, vol. 38, No. 2, Feb. 1991, pp. 145–159.

(List continued on next page.)

*Primary Examiner*—Howard L. Williams
*Attorney, Agent, or Firm*—Russell B. Miller; Brian S. Edmonston; Bruce W. Greenhaus

[57] ABSTRACT

A bandpass ΣΔ DC utilizing either a single-loop or a MASH architecture wherein the resonators are implemented as either a delay cell resonator, a delay cell based resonator, a Forward-Euler resonator, or a two-path interleaved resonator. The resonator can be synthesized with analog circuit techniques such as active-RC, gm-C, MOSFET-C, switched capacitor, or switched current. The switched capacitor or switched current circuits can be designed using single-sampling, double-sampling, or multi-sampling circuits. The non-stringent requirement of a ΣΔ ADC using switched capacitor circuits allows the ADC to be implemented in a CMOS process to minimize cost and reduce power consumption. Double-sampling circuits provide improved matching and improved tolerance to sampling clock jitter. In particular, a bandpass MASH 4-4 ΣΔ ADC provides a simulated signal-to-noise ratio of 85 dB at an oversampling ratio of 32 for a CDMA application. The bandpass ΣΔ ADC can also be used in conjunction with undersampling to provide a frequency downconversion.

40 Claims, 15 Drawing Sheets

OTHER PUBLICATIONS

"A High–Frequency and High–Resolution Fourth–Order A/D Converter in BiCMOS Technology" By Yin et al.; IEEE Journal of Solid–State Circuits, vol. 29, No. 8, Aug. 1994, pp. 857–865.

"A Third–Order Sigma–Delta Modulator with Extended Dynamic Range" by Williams et al.; IEEE Journal of Solid–State Circuits, vol. 29, No. 3, Mar. 1994, pp. 193–202.

"A 40 MHz IF Fourth–Order Double–Sampled SC Bandpass Modulator" by Bazarjani et al.; IEEE International Symposium on Circuits and Systems, Jun. 9–12, 1997 Hong Kong, pp. 73–76.

"Mixed Analog–Digital Design Considerations in Deep Submicron CMOS Technologies" By Bazarjani; Ottawa–Charleton institute for Electrical Engineering, Jul. 24, 1996.

Lowpass $$\frac{Z^{-1}}{1-Z^{-1}}$$

Bandpass $$\frac{-Z^{-2}}{1+Z^{-2}}$$

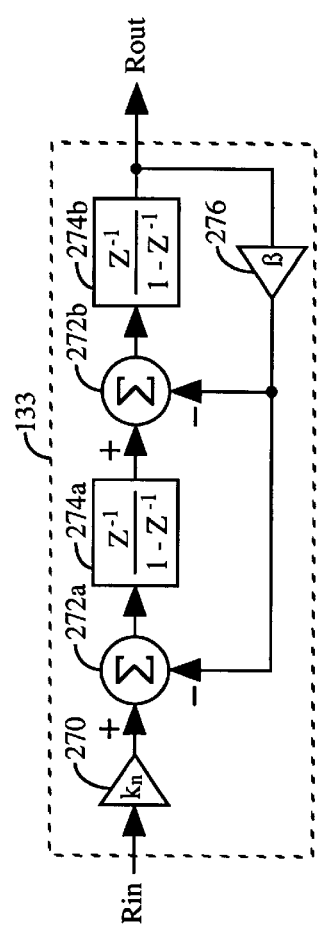
FIG. 5A
FIG. 5B
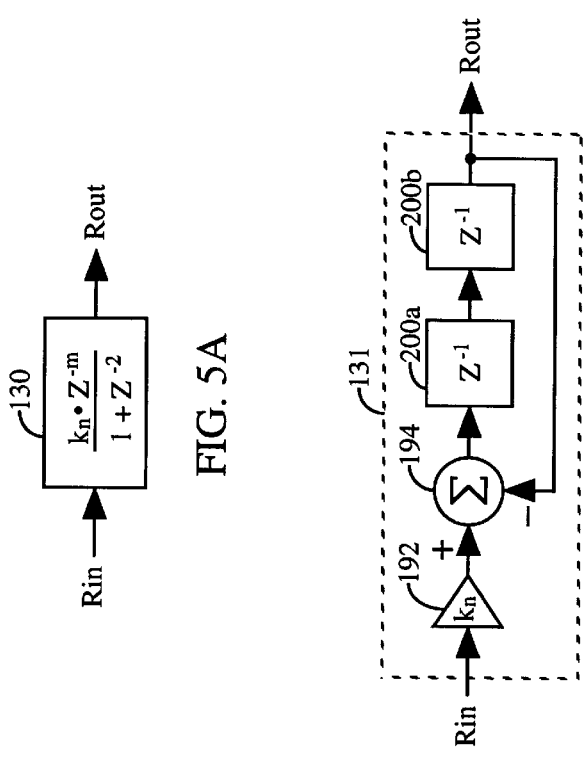
FIG. 5D
FIG. 5C
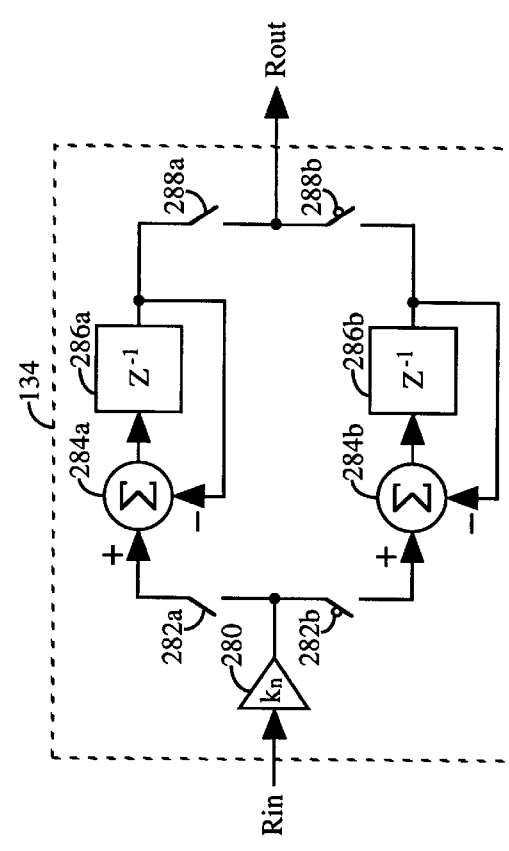
FIG. 5E

MULTI-LOOP ΣΔ ANALOG TO DIGITAL CONVERTER

BACKGROUND OF THE INVENTION

I. Field of the Invention

The present invention relates to electronic circuits. More particularly, the present invention relates to a novel and improved sigma-delta analog-to-digital converter (ΣΔ ADC).

II. Description of the Related Art

An analog-to-digital converter (ADC) is an important component in many electronic circuits, and is especially important in digital communication systems. An ADC converts a continuous analog waveform into discrete samples at evenly spaced time intervals. The samples can subsequently be processed by other digital signal processing blocks to provide enhancement, compression, and/or error detection/correction of the sampled data. Exemplary applications which require ADCs are code division multiple access (CDMA) communication system and high-definition television (HDTV).

Some important performance parameters of an ADC include linearity, DC offset, and signal-to-noise ratio (SNR). Suboptimal values for these parameters can cause degradation in the performance of a communication system. Linearity relates to the difference between an actual transfer curve (digital output versus analog input) and the ideal transfer curve. For a flash ADC, good linearity is more difficult to obtain as the number of bits in the ADC increases. The DC offset can degrade the acquisition and tracking performance of phase locked loops and the error detection/correction capability of the decoder, such as the Viterbi decoder. SNR can affect the bit-error-rate (BER) performance of the communication system because the quantization and circuit noise from the ADC results in degradation of the sampled data.

In many communication systems, the received RF signal is downconverted to baseband before quantization. Typically, the received signal is downconverted from an RF frequency to an intermediate frequency (IF) in the first downconversion stage. The first downconversion allows the receiver to downconvert signals at various RF frequencies to a fixed IF frequency where signal processing can be performed. For example, the fixed IF frequency allows for a fixed bandpass filter, such as a surface acoustic wave (SAW) filter, to remove undesirable images and spurious responses from the IF signal before the second downconversion stage. The IF signal is then downconverted to baseband where sampling is performed to provide the digitized baseband samples.

In most communication applications, an ADC is required at the receiver. In some applications, the receiver is a commercial unit where cost and reliability are important design criteria because of the number of units produced. Furthermore, in some applications, such as a CDMA mobile communication system, power consumption is critical because of the remote/portable nature of the receiver.

In the prior art, a flash ADC or a successive approximation ADC is used to sample the received signal. In the flash ADC, the input signal is compared against L-1 reference voltages, which are generated by a resistive ladder, by L-1 comparators. Flash ADCs are bulky and consume large amount of power because L-1 comparators and L resistors are required.

Furthermore, flash ADCs can have poor linearity and poor DC offset characteristics, if the L resistors in the resistive ladder are not matched. However, flash ADCs are popular because of their high speed.

Successive approximation ADCs are also often used in communication systems. These ADCs minimize complexity by performing approximations of the input signal over two or more stages. However, these ADCs can also exhibit the same poor linearity and poor DC offset characteristics as exhibited by the flash ADCs. Therefore, successive approximation ADCs as well as flash ADCs are not ideal candidates for use in many communication applications.

SUMMARY OF THE INVENTION

The present invention is a novel and improved sigma-delta analog-to-digital converter (ΣΔ ADC). The ΣΔ ADC design allows for high performance, high speed, and low cost. The high performance exhibited by ΣΔ ADCs includes high signal-to-noise ratio (SNR), good linearity, and low DC offset. ΣΔ ADCs can be designed using a single-loop architecture or a MASH (Multi-stAge noise SHaping) architecture. ΣΔ ADCs can be implemented as a bandpass or baseband ADC depending on the selection of the filters used within the feed back loops. The filters determine the noise transfer function of the ΣΔ ADC which, in turn, determines the frequency response of the quantization noise. ΣΔ ADCs can be synthesized with numerous analog circuit techniques such as active-RC, gm-C, MOSFET-C, switched capacitor, and switched current. Furthermore, the switched capacitor and switched current circuits can be implemented with single-sampling, double-sampling, or multi-sampling circuits.

It is an object of the present invention to provide a bandpass ΣΔ ADC with high SNR. In the exemplary embodiment, the bandpass ΣΔ ADC is an eighth order MASH 4-4 ADC which provides a simulated SNR of 85 dB. The high SNR allows the ADC to be used in applications which require many bits of resolution.

It is another object of the present invention to provide a bandpass ΣΔ ADC which performs bandpass sampling. Bandpass sampling can also be used in conjunction with undersampling to provide a frequency downconversion using the aliasing property of sampling. Bandpass subsampling can allow for the elimination of a frequency downconversion from an IF frequency to a lower frequency, thereby reducing the circuit complexity, minimizing cost, and improving reliability. The bandpass noise transfer function provided by the bandpass ΣΔ ADC provides a high SNR over the frequency band of interest.

It is yet another object of the present invention to provide a high speed bandpass ΣΔ ADC. In the exemplary embodiment, the present invention utilizes double-sampling switched capacitor circuits to sample the input signal at alternate phases of a switching clock. A set of input capacitors and feedback capacitors determine the noise transfer function of the ΣΔ ADC. In the double-sampling switched capacitor ΣΔ ADC, only the capacitors and switches of the first sampling stage are sensitive to path mismatch and clock jitter. Care can be used in the design of these components to minimize the performance degradation due to path mismatch and clock jitter.

It is yet another object of the present invention to provide a bandpass ΣΔ ADC which is cost effective and consumes minimal power. The ADC of the present invention can be implemented in CMOS since the amplifiers, comparators, switches, and capacitors which comprise the building blocks of the ΣΔ ADC do not need to be high performance. Furthermore, the performance of the ADC depends on the ratios of the capacitors, and not the absolute values of the capacitors, which are easy to achieve in CMOS process. CMOS allows the ADC to be built at low cost while consuming minimal power.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIGS. 5A–5E are block diagrams of a resonator within the bandpass MASH ΣΔ ADC and implementations of the resonator with a delay cell resonator, a lossless discrete integrator resonator, a Forward-Euler resonator, and a two-path interleaved resonator, respectively;

DETAILED DESCRIPTION OF THE PREFERRED EMBODIMENTS

Figure 1:
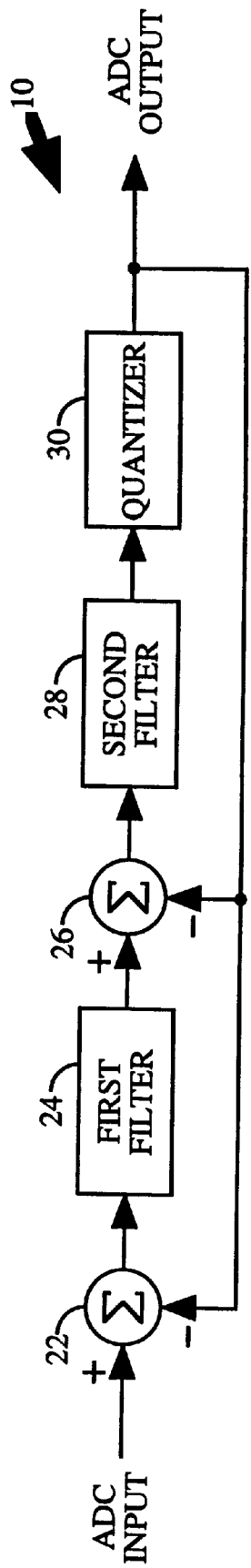
FIG. 1 is a block diagram of an exemplary single-loop sigma-delta analog-to-digital converter (ΣΔ ADC) architecture.

A high speed sigma-delta analog-to-digital converter (ΣΔ ADC) performs analog-to-digital conversion of the input signal by making successive one-bit approximations of the change in amplitude of the input signal, since the previous sample has already been approximated, at a sampling rate which is many times higher than the bandwidth of the input signal. The output samples comprise the input signal and the quantization noise. The ΣΔ ADC can be designed such that the quantization noise is pushed (or noise shaped) to an out-of-band frequency where filtering is more easily performed.

A ΣΔ ADC can provide high signal-to-noise ratio (SNR), good linearity, and low DC offset because of the inherent structure of ΣΔ ADC. For example, high SNR can be obtained by selecting a sufficient oversampling ratio (OSR) and the appropriate noise shaping filters. Additionally, good linearity and low DC offset are obtained because of the simple one-bit quantizer within the ΣΔ ADC.

High speed bandpass ΣΔ ADC can be used to perform the required analog-to-digital conversion of narrowband signals at an intermediate frequency (IF). Exemplary applications include CDMA communication system and HDTV. In a bandpass ΣΔ ADC, the input signal is at an IF frequency instead of baseband. Sampling at IF allows for the elimination of a downconversion stage in the communication system, thus reducing circuit complexity, decreasing cost, and improving reliability. Furthermore, the noise shaping filters within the bandpass ΣΔ ADC can be designed such that the quantization noise around the band of interest is pushed to out-of-band frequencies where filtering is more easily performed.

ΣΔ ADC samples an analog waveform in continuous time to provide discrete samples at evenly spaced time intervals. ΣΔ ADC has the following transfer function:

$$Y(z) = G(z) \cdot X(z) + H(z) \cdot E(z), \qquad (1)$$

where Y(z) is the output from the ΣΔ ADC in the z-transform domain, X(z) is the input to the ADC, E(z) is the quantization noise, G(z) is the transfer function from the input to the output, and H(z) is the noise transfer function from the quantizer to the output. Thus, the ADC output Y(z) comprises the input signal X(z) which is shaped by the transfer function G(z) plus the quantization noise E(z) which is shaped by the noise transfer function H(z). To avoid distortion of the input signal X(z), the transfer function G(z) is typically designed such that it is frequency independent. For example, G(z) can be an allpass function comprising a fixed gain ($A_1$) and delay elements ($z^{-1}$), such as $A_1 \cdot z^{-m}$. The quantization noise E(z) can be shaped by the noise transfer function H(z) such that the quantization noise in the band of interest (e.g. the band where the input signal is present) is pushed out-of-band where filtering is more easily performed. The characteristics of the noise transfer function H(z) is selected based on the application for which the ΣΔ ADC is used and is designed to provide the required performance.

I. ΣΔ ADC Architectures

ΣΔ ADC can be designed using one of many architectures. A block diagram of an exemplary single-loop ΣΔ ADC 10 is shown in FIG. 1. Single-loop ΣΔ ADC 10 comprises input summer 22 which subtracts the quantized ADC output from the ADC input. The error signal from summer 22 is provided to first filter 24 which filters the error signal in accordance with the transfer function of first filter 24. The output of first filter 24 is provided to summer 26 which subtracts the quantized ADC output from the output of first filter 24. The error signal from summer 26 is provided to second filter 28 which filters the error signal in accordance with the transfer function of second filter 28. The output of second filter 28 is quantized, typically to one bit although more bits can also be used, and provided as the quantized ADC output.

FIG. 1 illustrates a single loop ΣΔ ADC with two filter sections. The filter sections determine the noise shaping characteristics of the ΣΔ ADC and is designed based on the application for which the ΣΔ ADC is used. More filter sections can be interposed between second filter 28 and quantizer 30. However, single-loop ΣΔ ADCs are typically designed with two or less filter sections because of concerns with instability of higher order single-loop ΣΔ ADCs.

Figure 2:
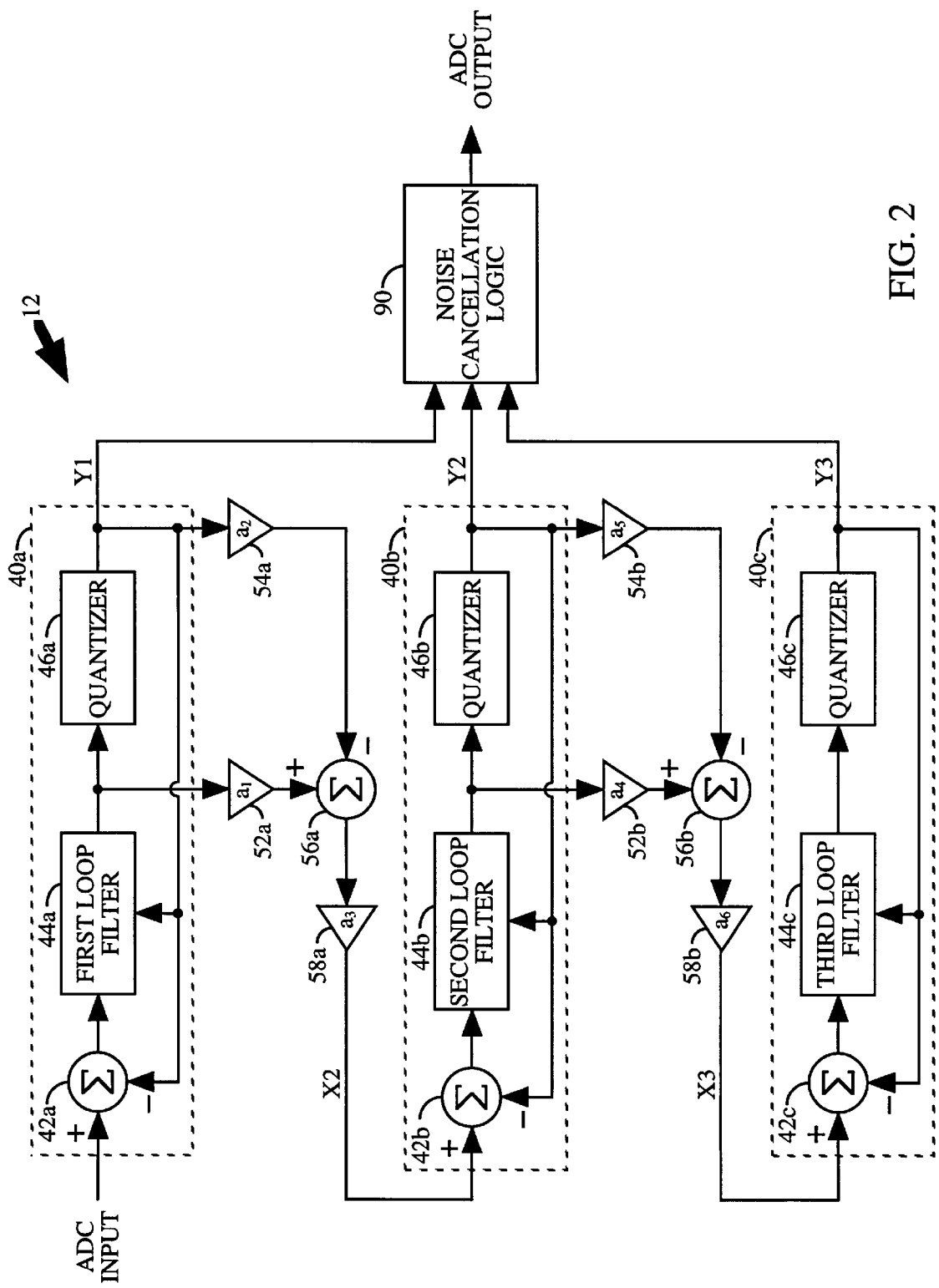
FIG. 2 is a block diagram of an exemplary MASH ΣΔ ADC architecture.

A block diagram of an exemplary MASH ΣΔ ADC architecture is shown in FIG. 2. A MASH ADC can be designed with two or more loops, depending on the desired noise transfer function H(z). However, MASH ADCs with more than three loops are not typically utilized because small incremental improvement is achieved for additional loops greater than three. The MASH architecture is preferred for a higher order ΣΔ ADC since the MASH architecture is inherently stable.

As shown in FIG. 2, a MASH ADC 12 comprises three loops 40a, 40b, and 40c. Loop 40a quantizes the ADC input and provides the output Y1 to noise cancellation logic 90. The operation of noise cancellation 90 is described in detail below. A fraction of the ADC input and quantization noise (X2) from loop 40a is provided to loop 40b where additional noise shaping is performed. Finally, a fraction of the ADC input and quantization noise (X3) from loop 40b is provided to loop 40c where further noise shaping is performed. The output Y2 from loop 40b and Y3 from loop 40c are provided to noise cancellation logic 90 where they are combined with the output Y1 from loop 40a to produce the ADC output. In the exemplary embodiment, ADC output comprises one bit for each loop. After noise cancellation, the dynamic range, and thus the output of MASH ADC 12, can be three bits or more.

Within each loop 40, summer 42 receives the input signal and the quantizer output from quantizer 46. Summer 42 subtracts the quantizer output from the input signal and provides the error signal to loop filter 44. Loop filter 44 filters the error signal and provides the filtered output to quantizer 46 where it is quantized to one-bit values. Loop filter 44 is designed to produce the desired noise transfer function H(z) which is based on the application for which the ΣΔ ADC is used. The filtered output from loop filter 44 in all but the last loop 40c is provided to gain element 52 and scaled with a first gain. The output from quantizer 46 in all but the last loop 40c is provided to gain element 54 and scaled with a second gain. The scaled signal from gain element 54 is subtracted from the scaled signal from gain element 52 by summer 56 and the error signal is provided to gain element 56. Gain element 56 scales the error signal with a third gain and provides the scaled error signal to the subsequent loop 40. The gains of gain elements 52, 54, and 58 affect the noise transfer function H(z) of MASH ADC 12.

Each loop filter 44 can comprise one or more filter sections, depending on the desired noise transfer function. More filter sections allow for implementation of higher order ΣΔ ADC to produce the desired performance, such as high SNR. A loop filter design is described in detail below.

In this specification, a MASH ΣΔ ADC is designated in accordance with the following nomenclature. MASH A-B-C denotes three loops (A, B, and C) which are of the order designated by the values of A, B, and C. For example, MASH 4-2-2 denotes a three loop architecture, with the first loop having a fourth order filter, the second loop having a second order filter, and the third loop also having a second order filter. Overall, MASH 4-2-2 is an eighth order ΣΔ ADC. The present invention can be directed toward a MASH 2-2, MASH 4-2, MASH 4-4, MASH 4-2-2, MASH 4-4-2, MASH 4-4-4 and other orders of MASH ΣΔ ADC.

The selection of the desired ΣΔ ADC architecture, single-loop or MASH, depends on a number of factors. One important factor is the required signal-to-noise ratio (SNR). SNR is defined as the ratio of the power of the largest input signal to the power of the quantization noise. For a full-scale sinewave input, the SNR for a ΣΔ ADC can be calculated according to the following equation:

$$SNR = \frac{3}{2} \cdot \frac{2L+1}{\pi^{2L}} \cdot (OSR)^{2L+1}, \qquad (2)$$

where L is the order of the loop filter used for noise shaping and OSR is the oversampling ratio. OSR is defined as the ratio of the sampling rate over the two-sided signal bandwidth, $$OSR = \frac{f_s}{2f_{BW}}.$$

Equation (2) is based on the simple theory using only white quantization noise and a unity gain quantizer.

Using equation (2) the SNR is calculated for an exemplary CDMA application wherein the 2-sided signal bandwidth $2f_{BW}=2.4576$ MHz and the sampling rate is approximately 78.64 MHz. These frequencies produce an OSR of 32. The SNR is calculated for various loop filter order L and the results are tabulated in Table 1. The loop filter order is the summation of the order of all filters within the ΣΔ ADC. For a bandpass ΣΔ ADC, the loop filter order L is half of the overall order of the bandpass filters. An n-th order bandpass filter has an effective order of L=n/2 because the poles in the bandpass transfer function are divided evenly between the upper half of the z-plane and the lower half of the z-plane. The calculated SNR values in Table 1 represent the upper bound which can be achieved. The actual SNR may be 10 dB to 15 dB less than the calculated values due to non-ideal circuit components and limitation of the input signal to less than the full-scale value.

For the CDMA application described above, the SNR is simulated to be 70 dB for a bandpass MASH 4-2 ADC, 85 dB for a MASH 4-4, 60 dB for a sixth order single-loop bandpass ΣΔ ADC, and 62 dB for an eighth order single-loop ADC. The simulated results are also tabulated in Table 1. The simulated results assume an input signal at −10 dB below full-scale and coincident zeros (e.g. all zeros are placed at z=±j) in the noise transfer function H(z). The simulated SNR value for the sixth order single-loop ΣΔ ADC can be improved to 70 dB if the zeros are spread across the signal bandwidth. Similarly, the simulated SNR value for the eighth order single-loop ΣΔ ADC can be improved to 80dB with zero spreading. However, zero spreading can be difficult to achieve due to non-ideal circuit components. The simulated SNR of a MASH architecture is better than that of the single-loop architecture.

TABLE 1

Calculated and Simulated SNR for ΣΔ ADC of Various Order

| loop order L | BPF order | SNR (dB) | | | |
|---|---|---|---|---|---|
| | | calculated | simulated MASH 4-2 | simulated MASH 4-4 | simulated single-loop |
| 2 | 4 | 64 | | | |
| 3 | 6 | 85 | 70 | | 60 |
| 4 | 8 | 107 | | 85 | 62 |

In actual implementation, the MASH architecture has the additional advantages of inherent stability and ease of loop filter design. However, circuit matching is more critical for the MASH architecture because of the need to cancel the quantization noise between multiple loops. The single-loop architecture is stable for second order or lower order loops but may be unstable for higher order loops. Higher order single-loop designs can be made stable by careful circuit design and thorough simulation. However, the single-loop architecture is more tolerant to circuit mismatch. The selection of the single-loop or MASH architecture is dependent on the requirements of the application. For most applications, the MASH architecture is preferred over the single-loop architecture.

The noise transfer function H(z) of MASH ADC 12 is determined by the design of loop filters 44. For example, a baseband MASH ΣΔ ADC can be designed by implementing loop filters 44 with lowpass filters. Similarly, a bandpass ΣΔ ADC can be designed by implementing loop filters 44 with bandpass filters. The noise transfer function H(z) of the quantization noise is the inverse of the filter characteristics because the loop filters reside within the loops.

An exemplary baseband MASH ΣΔ ADC can be designed by implementing loop filters 44 with one or more integrators having the lowpass transfer function $$\frac{z^{-1}}{1-z^{-1}}.$$

Figure 3A:
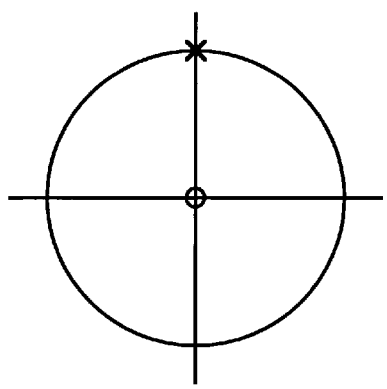
FIGS. 3A–3D are pole-zero diagram and frequency response plot of an integrator and pole-zero diagram and frequency response plot of a bandpass resonator, respectively.
Figure 3B:
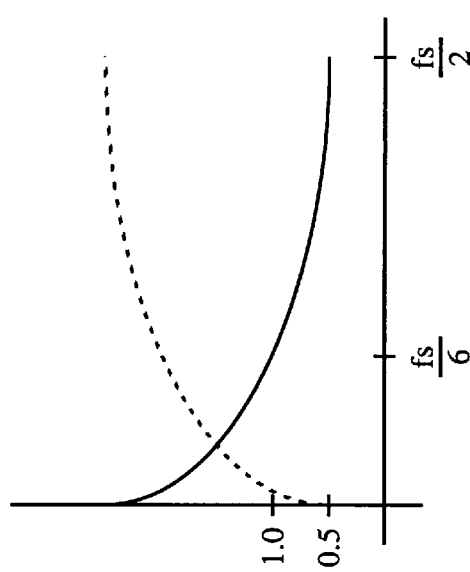

The number of integrators within loop filters 44 depends on the desired noise transfer function H(z). As shown in FIG. 3A, the lowpass transfer function has a pole at z=+1 and a zero at the origin z=0. The frequency response of the lowpass transfer function is shown in FIG. 3B by the solid line. The lowpass filter has the highest gain at DC because of the pole at z=+1, a gain of 1.0 at fs/6, and a gain of 0.5 at fs/2 where fs is the sampling frequency. The frequency response of the noise transfer function is shown in FIG. 3B by the dashed line. The quantization noise around DC is pushed toward higher frequency.

An exemplary bandpass MASH ΣΔ ADC can be designed by implementing loop filters 44 with one or more resonators having the bandpass transfer function $$\frac{z^{-2}}{1+z^{-2}}.$$

Figure 3C:
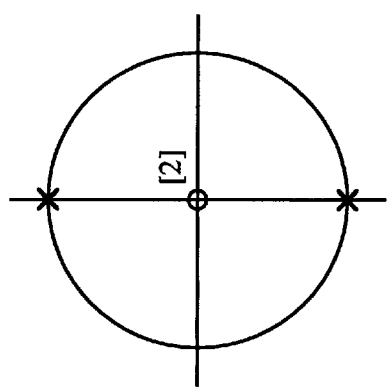
Figure 3D:
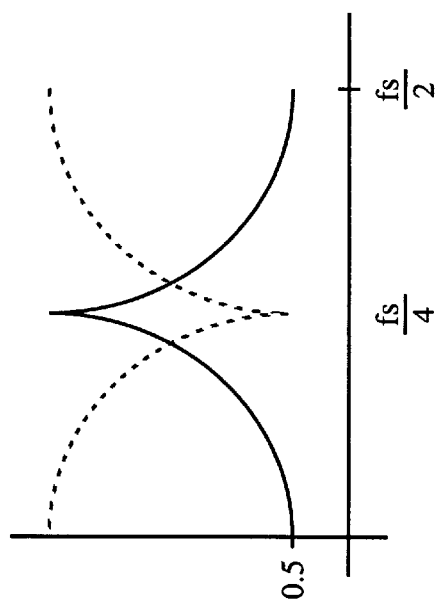

The number of resonators within loop filters 44 depends on the desired noise transfer function H(z). For example, a fourth order loop requires two resonator sections each having the bandpass transfer function as described above. A bandpass transfer function can be obtained from a lowpass transfer function by substituting $z^{-1}$ in the lowpass transfer function with $-z^{-2}$. As shown in FIG. 3C, the bandpass transfer function has a pair of poles at z=±j and two zeros at the origin z=0. The frequency response of the bandpass transfer function is shown in FIG. 3D by the solid line. The bandpass filter has the highest gain at fs/4, because of the poles at z=±j, and a gain of 0.5 at DC and at fs/2. The frequency response of the noise transfer function is shown in FIG. 3D by the dashed line. The quantization noise around fs/4 is pushed away from fs/4, the frequency band of interest, toward DC and fs/2.

II. Bandpass MASH ΣΔ ADC Architecture

Figure 4:
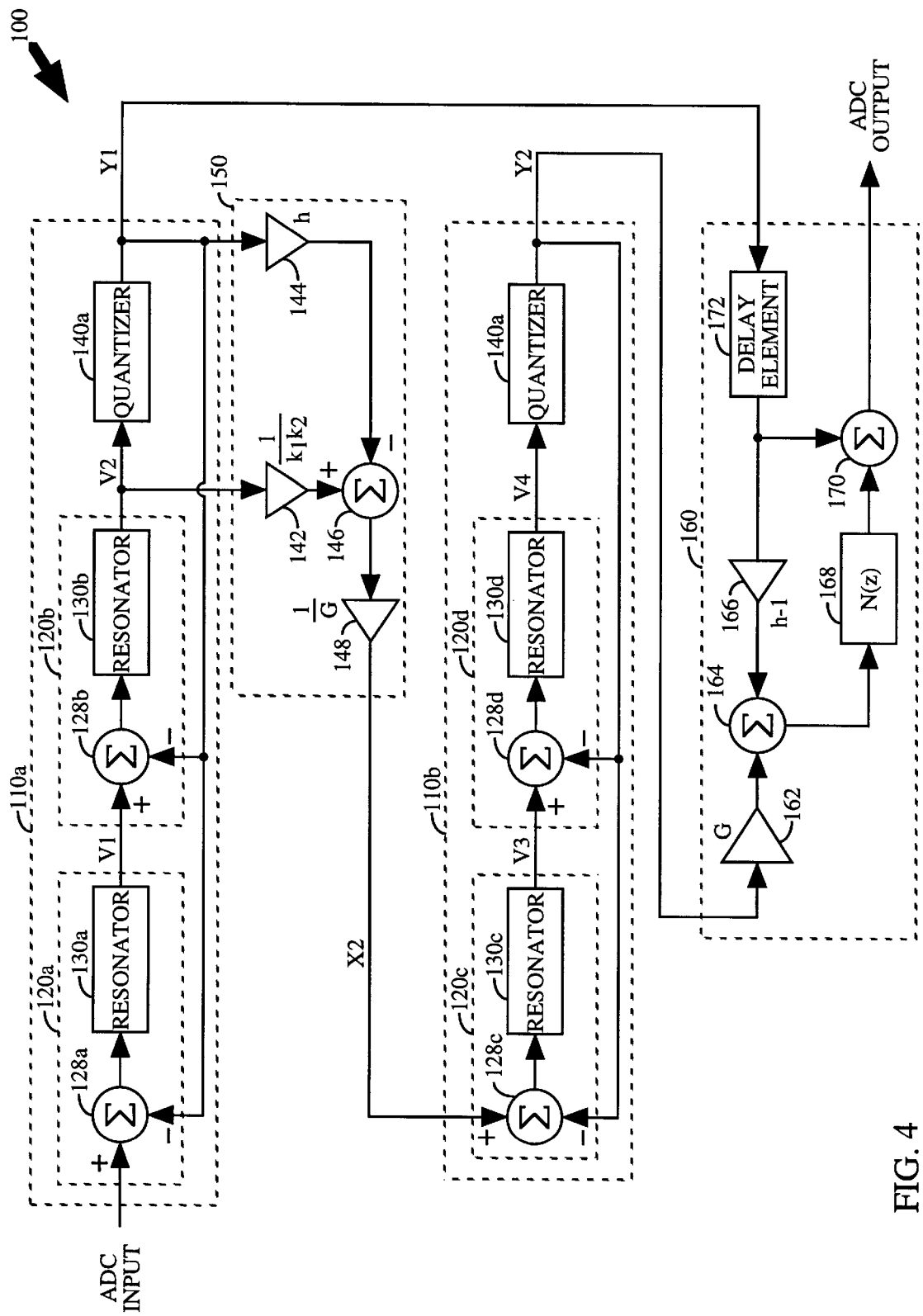
FIG. 4 is a block diagram of an exemplary two loop bandpass MASH ΣΔ ADC of the present invention.

A block diagram of an exemplary two loop bandpass MASH ΣΔ ADC is illustrated in FIG. 4. MASH ADC 100 comprises two loops 110a and 110b, feed forward element 150, and noise cancellation logic 160. In the exemplary embodiment, MASH ADC 100 receives an analog ADC input and produces a digital ADC output having at least two bits, at least one bit for each loop 110.

The ADC input is provided to loop 110a which produces a 1-bit output Y1 in response thereto. A fraction of the ADC input and quantization noise (X2) from loop 110a is provided to loop 110b where additional noise shaping is performed. The outputs Y1 and Y2 from loops 110a and 110b, respectively, are provided to noise cancellation logic 160. Noise cancellation logic 160 combines the outputs Y1 and Y2 and produces the ADC output.

Within loop 110a, summer 128a receives the ADC input and the 1-bit output Y1 from quantizer 140a. Summer 128a subtracts Y1 from the ADC input and provides the error signal to resonator 130a. Resonator 130a filters the error signal and provides the filtered output (V1) to summer 128b. Summer 128b also receives Y1 from quantizer 140a and subtracts Y1 from V1. The error signal from summer 128b is provided to resonator 130b which further filters the error signal. The filtered output (V2) from resonator 130b is provided to quantizer 140a which produces the 1-bit output Y1 in response thereto. Loop 110b is connected in similar manner as loop 110a.

The filtered output V2 from resonator 130b is also provided to gain element 142 which scales V2 by the scaling factor $1/k_1k_2$. The output Y1 from quantizer 140a is provided to gain element 144 which scales Y1 by the scaling factor h. The outputs from gain elements 142 and 144 are provided to summer 146 which subtracts the output from gain element 144 from the output from gain element 142. The error signal from summer 146 is provided to gain element 148 which scales the error signal by the scaling factor 1/G. The output from gain element 148 comprises X2 which is provided to loop 110b.

Within noise cancellation logic 160, the output Y1 is provided to delay element 172 which delays Y1 by a time interval equal to the processing delay of loop 110b. The delayed Y1 from delay element 172 is time aligned with Y2. The output Y2 is provided to gain element 162 which scales Y2 by the scaling factor G. The delayed output Y1 is provided to gain element 166 which scales the delayed Y1 by the scaling factor h−1. The outputs from gain elements 162 and 166 are provided to summer 164 which sums the two scaled outputs. The combined signal from summer 164 is provided to element 168 which filters the combined signal with the transfer function N(z). The output from element 168 and the delayed Y1 are provided to summer 170 which sums the two signals to produce the ADC output.

For a bandpass ΣΔ ADC, each resonator 130 in MASH ADC 100 is implemented with a bandpass transfer function $$\frac{k_n \cdot z^{-m}}{1+z^{-2}},$$

where $k_n$ is the gain of the n-th resonator 130 within loop 110 and m=1 or 2. Each resonator 130 comprises a pair of poles and is second order. Since each loop 110 contains two resonators 130, the order of each loop is four. Overall, MASH ADC 100 is an eighth order MASH 4-4 ADC. The transfer function N(z) within element 168 is selected based on the characteristics of the ΣΔ ADC. For a bandpass ΣΔ ADC, N(z)=(1+z$^{-2}$). Delay element 172 has a transfer function of z$^{-2m}$.

The gains $k_1$, $k_2$, h, and G which are reflected in the scaling factors of gain elements 142, 144, 148, 162, and 166 determine the location of the zeros of the noise transfer function H(z). The poles in resonators 130 are transformed into zeros in the noise transfer function H(z) because the resonators reside within a feedback loop. Initially, the zeros in H(z) are selected to be at z=±j for the bandpass ΣΔ ADC.

MASH ADC 100, as illustrated in FIG. 4, is a bandpass ΣΔ ADC. The same topology can be used to implement a baseband ΣΔ ADC. This can be easily achieved by substituting each resonator 130 with an integrator having the lowpass transfer function $$\frac{z^{-1}}{1-z^{-1}},$$

implementing element 168 with the transfer function N(z)= $(1-z^{-1})^2$, and providing delay element 172 with the transfer function z$^{-2}$. With these substitutions, MASH ADC 100 is transformed into a fourth order baseband MASH 2-2 ADC.

In the exemplary embodiment, all elements of MASH ADC 100, except for noise cancellation logic 160, are implemented as analog circuits. However, the optimal implementation of an element in either analog or digital circuit may depend on the IC process used in implementing the ΣΔ ADC. Therefore, the various combinations of analog and digital circuits to synthesize the required elements within MASH ADC 100 are within the scope of the present invention.

III. Bandpass Resonator Design

A bandpass MASH 4-4 ADC can be designed by implementing resonators 130 in MASH ADC 100 with a bandpass transfer function $$\frac{z^{-2}}{1+z^{-2}}$$

as described above. Thus, resonators 130a, 130b, 130c, and 130d have the same structure. However, the gain of resonators 130a and 130c is $k_1$ whereas the gain of resonators 130b and 130d is $k_2$. Resonator 130 is illustrated in FIG. 5A. Resonator 130 can be implemented by many resonator structures, four of which are illustrated in FIGS. 5B–5E. Resonators 131, 132, 133 and 134 receive the input signal Rin and produce the output signal Rout.

A block diagram of an exemplary delay cell resonator 131 is shown in FIG. 5B. The input signal Rin is provided to gain element 192 which scales the input signal with the gain kn. The scaled Rin is provided to summer 194 which also receives the output signal Rout and subtracts Rout from the scaled Rin. The error signal from summer 194 is provided to delay element 200a which delays the signal by one clock cycle of the sampling clock. The delayed error signal from delay element 200a is provided to delay element 200b which further delays the signal by one sampling clock cycle. The signal from delay element 200b comprises the output signal Rout.

A block diagram of an exemplary lossless discrete integrator (LDI) resonator 132 is shown in FIG. 5C. The input signal Rin is provided to gain element 260 which scales the input signal with the gain $k_n$. The scaled Rin is provided to summer 262 which also receives the scaled output signal Rout and subtracts the scaled Rout from the scaled Rin. The error signal from summer 262 is provided to filter 264 which filters the signal with the transfer function $$\frac{z^{-1}}{1-z^{-1}}.$$

The filtered error signal from filter 264 is provided to filter 266 which further filters the signal with the transfer function $$\frac{1}{1-z^{-1}}.$$

The signal from filter 266 comprises the output signal Rout. Rout is provided to gain element 268 which scales Rout with the gain β. In the exemplary embodiment, β=2 and the overall transfer function of resonator 132 is $$\frac{k_n \cdot z^{-1}}{1+z^{-2}}.$$

By proper selection of β, the zeros of the noise transfer function can be spread in the signal band.

A block diagram of an exemplary Forward-Euler (FE) resonator 133 is shown in FIG. 5D. The input signal Rin is provided to gain element 270 which scales the input signal with the gain $k_n$. The scaled Rin is provided to summer 272a which also receives the scaled output signal Rout and subtracts the scaled output signal Rout from the scaled input signal Rin. The error signal from summer 272a is provided to filter 274a which filters the signal with the transfer function $$\frac{k_n \cdot z^{-2}}{1+z^{-2}}.$$

The filtered error signal from filter 274a is provided to summer 272b which also receives the scaled Rout and subtracts the scaled Rout from the filtered error signal. The error signal from summer 272b is provided to filter 274b which filters the signal with the transfer function $$\frac{k_n \cdot z^{-2}}{1+z^{-2}}.$$

The signal from filter 274b comprises the output signal Rout. Rout is provided to gain element 276 which scales the output signal Rout with the gain β. In the exemplary embodiment, β=2 and the overall transfer function of resonator 133 is $$\frac{k_n \cdot z^{-2}}{1+z^{-2}}.$$

A block diagram of an exemplary two-path interleaved resonator 134 is shown in FIG. 5E. The input signal Rin is provided to gain element 280 which scales the input signal with the gain $k_n$. The scaled Rin is provided to switches 282a and 282b which connects the scaled Rin to summers 284a and 284b, respectively. Summer 284 also receives the delayed error signal from delay elements 286 and subtracts the delayed error signal from the scaled Rin. The error signal from summer 284 is provided to delay element 286 which delays the error signal by one sampling clock cycle. The delayed error signal from delay elements 286a and 286b are provided to switches 288a and 288b, respectively. Switches 288a and 288b connect together and comprise the output of resonator 134. Switches 282a and 288a are clocked by one phase of a switching clock and switches 282b and 288b are clocked by a second phase of the switching clock. The clock signals are described in detail below. The overall transfer function of resonator 134 is $$\frac{k_n \cdot z^{-2}}{1 + z^{-2}}.$$

Resonators 131, 132, 133 and 134 can be implemented by numerous analog circuit techniques. For example, resonators 131, 132, 133 and 134 can be implemented with continuous time analog circuit techniques such as active-RC, gm-C, and MOSFET-C. Resonators 131, 132, 133 and 134 can also be implemented with sampled-data analog circuit techniques such as switched capacitor and switched current. The selection of the analog circuit technique depends on the requirement of the application for which the $\Sigma\Delta$ ADC is used. For an exemplary CDMA application wherein a 12-bit $\Sigma\Delta$ ADC operating at a sampling rate of 80 MHz, the performance of the various circuit techniques is tabulated in Table 2.

TABLE 2

Performance of Various Analog Circuit Techniques

| analog circuit technique | resolution SNR | accuracy (time constant) | speed | technology |
|---|---|---|---|---|
| active-RC | yes | no | yes | bipolar/CMOS |
| gm-C | possibly | yes (with tuning) | yes | BiCMOS |
| switched capacitor | yes | yes | yes | CMOS |
| switched current | possibly | yes | yes | digital CMOS |

The implementation of the functions as described herein using any one of the circuit techniques listed in Table 2, or its equivalents, are within the scope of the present invention. In the preferred embodiment, resonators 131, 132, 133 and 134 are implemented with a switched capacitor circuit technique because of superior performance in SNR, accuracy, speed, and cost.

Figure 6B:
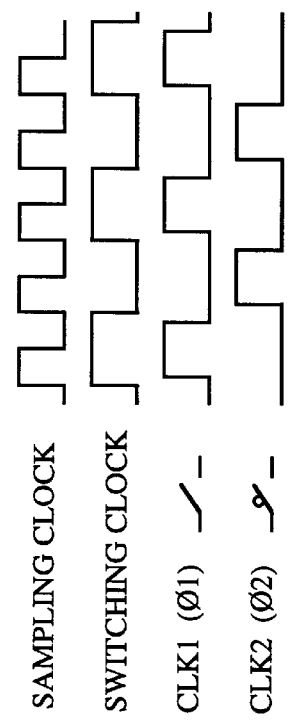
FIGS. 6A–6B are schematic diagram of a delay cell using double-sampling switched capacitor analog circuit technique and timing diagram of the required clock signals for the delay cell, respectively.
Figure 6A:
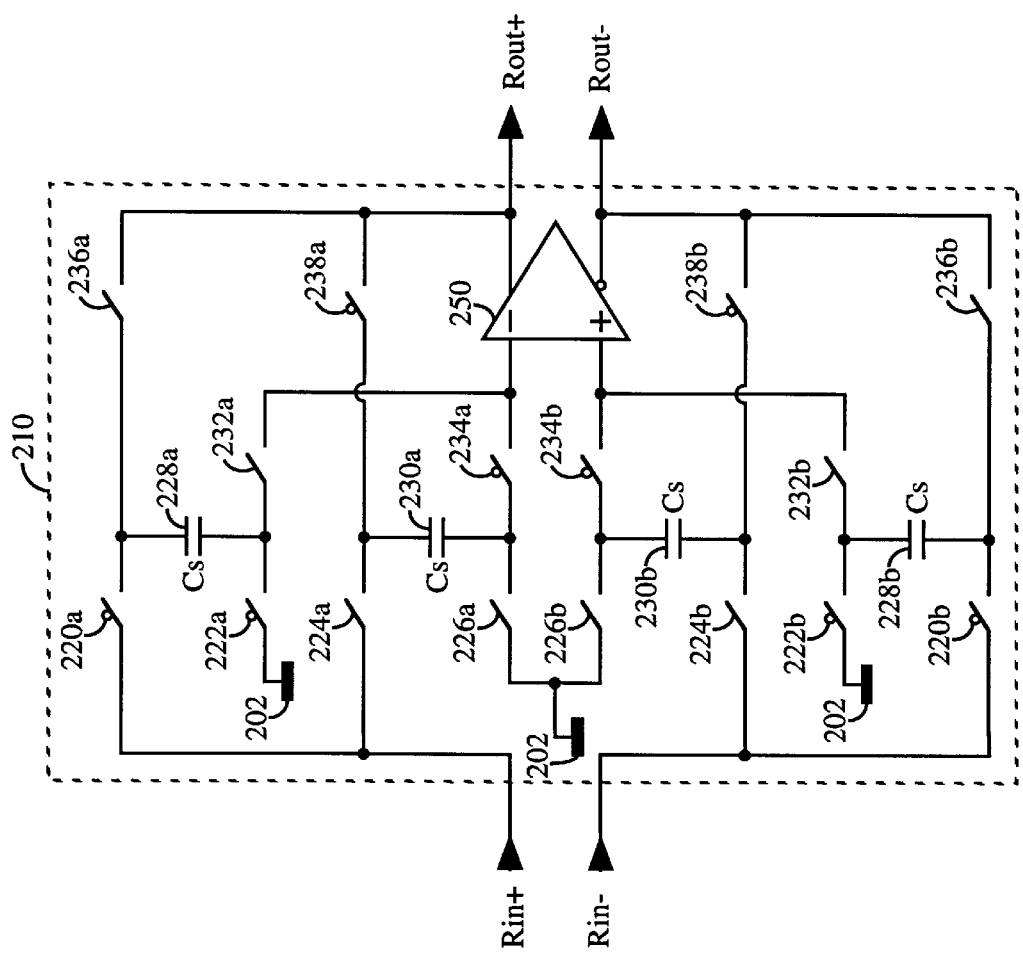

The design of resonator 131 using the switched capacitor circuit technique is described in detail below. Within resonator 131, each delay element 200 can be implemented by one of many analog circuit techniques. In the preferred embodiment, delay element 200 is implemented with a double-sampling switched capacitor delay circuit 210 as illustrated in FIG. 6A. For optimal linearity and noise performance, delay circuit 210 is implemented as a fully differential circuit, where the input comprises Rin+ and Rin– and the output comprises Rout+ and Rout–.

Within delay circuit 210, the input signal Rin+ is provided to two signal paths through switches 220a and 224a. Switch 220a connects to one end of capacitor 228a and switch 236a. The other end of capacitor 228a connects to switches 222a and 232a. Switch 222a also connects to AC ground 202. Switch 232a also connects to the inverting input of amplifier 250 and switch 236a also connects to the non-inverting output of amplifier 250. In similar manner, switch 224a connects to one end of capacitor 230a and switch 238a. The other end of capacitor 230a connects to switches 226a and 234a. Switch 226a also connects to AC ground 202. Switch 234a also connects to the inverting input of amplifier 250 and switch 238a also connects to the non-inverting output of amplifier 250. Delay circuit 210 is a fully differential circuit. The lower half of delay circuit 210 is a mirror image of the upper half.

AC ground 202 is implemented as a DC bias voltage with a capacitor bypass to ground. The DC bias voltage determines the mid-scale voltage of the differential signal at that node. For best linearity, the signals Rin+ and Rin– are normally biased near the operating center of amplifier 250. In some circuit design, the differential output Rout+ and Rout– can have a different optimal DC bias voltage than that of the input Rin.

Delay circuit 210 samples the input signal Rin on two phases of the switching clock. Referring to FIG. 6B, the sampling clock fs is divided by two to obtain the switching clock. In the exemplary embodiment, the clock signal CLK1 having the first clock phase $\phi 1$ is provided to the switches which are shown without the bubble (e.g. switch 224a). The clock signal CLK2 having the second clock phase $\phi 2$ is provided to the switches which are shown with the bubble (e.g. switch 220a). Each clock signal should have a duty cycle which is less than 50 percent. The minimum width of the clock signals is determined by the charging time of the capacitors which, in turn, is determined by the size of the capacitor and the ON resistance of the switches.

Referring to FIG. 6A, during the first clock phase $\phi 1$, switches 224a and 226a are switched ON and capacitor 230a is charged with the input signal Rin+. During the second clock phase $\phi 2$, switches 224a and 226a are switched OFF, switches 234a and 238a are switched ON, and the voltage across capacitor 230a is provided to the output Rout+. Capacitor 230a is charged during the first clock phase $\phi 1$ and provided to the output Rout+during the second clock phase $\phi 2$. Therefore, the delay provided by delay circuit 210 is a half switching clock cycle, or one sampling clock cycle. Similarly, capacitor 228a is charged during the second clock phase $\phi 2$ and provided to the output Rout+ during the first clock phase $\phi 1$. The two signal paths, one through capacitor 230a and the second through capacitor 228a, operate on different clock phases and only share amplifier 250.

Using double-sampling switched capacitor circuit, the input signal Rin is provided to the output Rout on both phases of the switching clock, through two signal paths, thereby resulting in the sampling of Rin at the sampling clock frequency fs even though the switches are switched ON and OFF at half the sampling clock (fs/2). A double-sampling switched capacitor circuit allows the switches to be clocked at half the sampling frequency, thus allowing the capacitors and amplifier more time to settle to the final value. Since the operating speed of a switched capacitor circuit is determined by the settling time of the amplifier used in the circuit, using the same amplifier during both phases of the switching clock increases the sampling rate by a factor of two without requiring faster settling amplifier.

However, double-sampling switched capacitor circuits are sensitive to path mismatch. Mismatch in the first sampling stage of the $\Sigma\Delta$ ADC can cause degradation in the output samples. Mismatch in the subsequent stages is noise shaped and does not result in noticeable degradation. Any mismatch between the two signal paths, such as mismatch in the capacitors or mismatch due to uneven clock phases, in the first stage produces an image of the input signal to appear at the output samples. By using good circuit design rules, the capacitor mismatch can be reduced to one percent or less, thereby minimizing the amplitude of the image to −40 dB or more below the amplitude of the input signal. The switching clocks can be designed to minimize uneven clock phases. Alternatively, the first sampling stage can be clocked with a master clock, before the divide-by-two operation to obtain the switching clocks. Clock jitter can be reduced by using a clean external clock source. This topology also have faster settling time than the single-sampled topology because of less amplifier loading.

IV. Bandpass MASH 4-4 ADC Design

Referring to FIG. 4, each loop 110 comprises two resonator sections 120. Each resonator section 120 comprises summer 128 and resonator 130. Resonator 130 can be implemented as delay cell resonator 131 as shown in FIG. 5B. Each delay cell resonator 131 comprises two delay elements 200. Each delay element 200 can be implemented with double-sampling switched capacitor delay circuit 210 as shown in FIG. 6A.

Figure 7A:
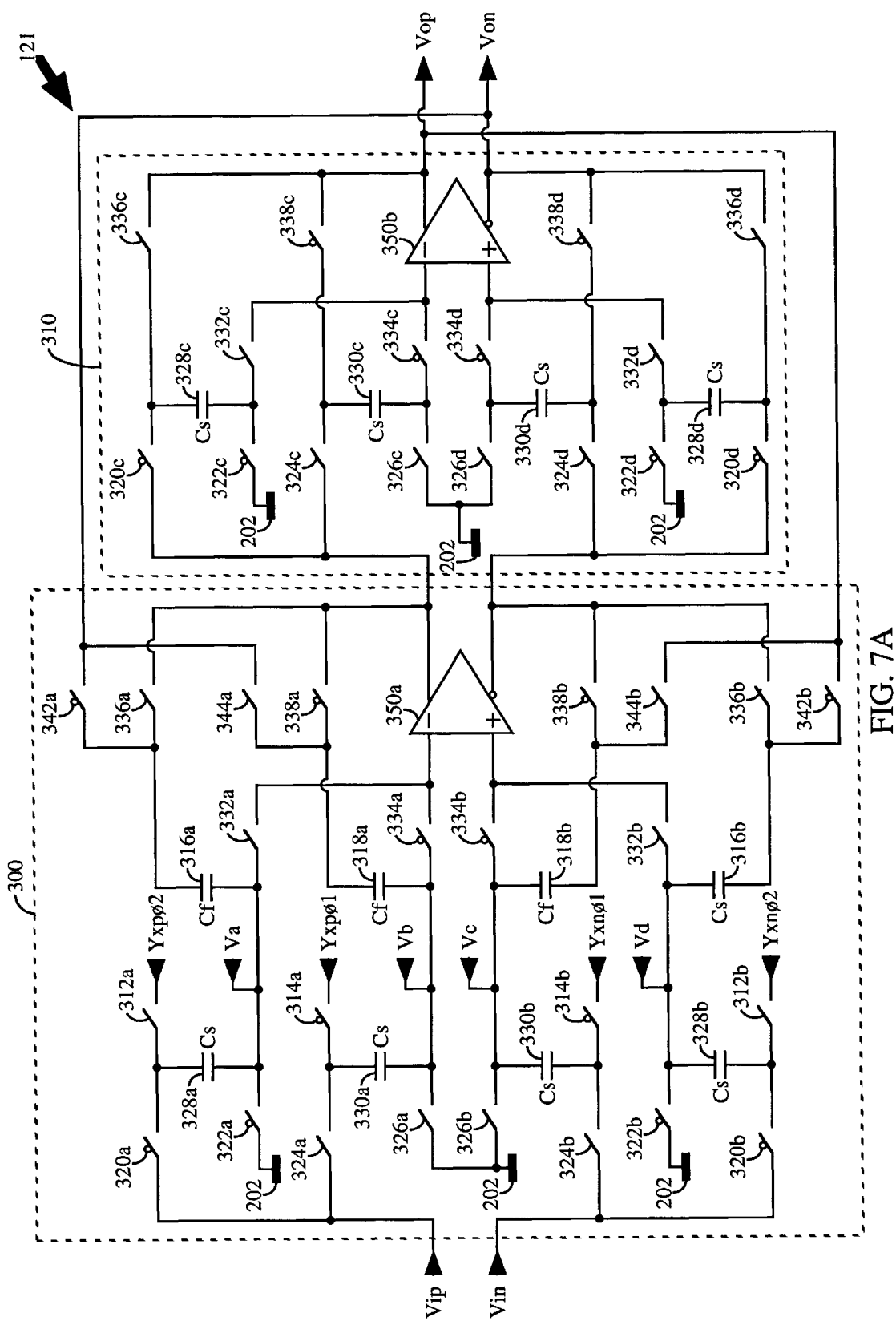
FIGS. 7A–7B are schematic diagrams of a resonator circuit within the bandpass MASH ΣΔ ADC and the feed-forward gain circuit, respectively, both of which are implemented using double-sampling switched capacitor analog circuit technique.

A schematic diagram of double-sampling switched capacitor resonator circuit 121, which implements resonator section 120, is shown in FIG. 7A. Resonator circuit 121 comprises delay element and summer circuit 300 and delay circuit 310. Circuit 300 incorporates summer 128, gain element 192, summer 194, and delay element 200a (see FIGS. 4 and 5B). Delay circuit 310 implements delay element 200b.

Referring to FIG. 7A, within circuit 300, the input signal Vip is provided to two signal paths, the first signal path through switch 324a. Switch 324a connects to one end of capacitor 330a and switch 314a. The other end of capacitor 330a connects to switches 326a and 334a. Switch 326a also connects to AC ground 202 and switch 334a also connects to the inverting input of amplifier 350a. Switch 314a connects to the quantizer output Ypφ1 which is described below. Switches 326a and 334a connect to one end of capacitor 318a. The other end of capacitor 318a connects to switches 344a and 338a. Switch 338a also connects to the non-inverting output of amplifier 350a. Switch 344a also connects to the inverting output of amplifier 350b within delay circuit 310.

The operation of the first signal path in circuit 300 can be described as follows. During the first clock phase φ1, switches 324a and 326a are switched ON and capacitor 330a is charged with the input signal Vip. During the second clock phase φ2, switches 324a and 326a are switched OFF and switches 314a, 334a, and 338a are switched ON. The input signal Yxpφ1 and the voltage across capacitor 330a are scaled by the ratio of capacitors 330a and 318a (Cs/Cf) and provided to the non-inverting output of amplifier 350a. Also during the first clock phase φ1, switch 344a is switched ON and the signal from the inverting output of amplifier 350b is fed back, charging capacitor 318a. The voltage across capacitor 318a is reflected at the non-inverting output of amplifier 350a during the second clock phase φ2.

The above discussion describes the circuit connection and operation of the first signal path within circuit 300. An identical circuit is provided for the second signal path which operates in the same manner as that of the first signal path, except the switches are clocked at the alternative phase of the switching clock. Thus, the input signal Vip is provided to the output of amplifier 350a on both phases of the switching clock and results in the sampling of the input signal at the sampling rate.

Circuit 300 is a fully differential circuit. An identical circuit is provided for the inverting input signal Vin. The lower half of circuit 300 is the mirror image of the upper half.

Circuit 300 includes the functions of summer 128, gain element 192, and summer 194 (see FIGS. 4 and 5B). The function of summer 194 is provided by switches 342 and 344 which connects the output of the second delay element to capacitors 316 and 318, respectively. The voltage Von is stored in capacitor 318a during the first clock phase φ1 and subtracted from the voltage at Vb during the second clock phase φ2. The function of summer 128 is provided by switches 312 and 314 which connect the quantizer output to capacitors 328 and 330, respectively. The quantizer output voltage Ypφ1 is provided to capacitor 330a during the second clock phase φ2 and is added to the voltage at Vb.

Delay circuit 310 is identical to delay circuit 210 in FIG. 6A and operates in the same manner as that described above for delay circuit 210. Delay circuit 310 delays the output from circuit 300 by a half switching clock cycle, or one sampling clock cycle. The output from amplifier 350b comprises the output of resonator circuit 121.

Resonator circuit 121 has the following transfer function from Vip to Vop:

$$H_R(z) = \frac{C_s}{C_f} \cdot \frac{z^{-2}}{1+z^{-2}}. \qquad (3)$$

The transfer function from Yxpφ1 to Vop is −$H_R(z)$. In this nomenclature, Yx denotes the quantizer output from the first (x=1) or second (x=2) loop, p or n denotes a (+) or (−) signal, and φ1 or φ2 denotes the clock phase of the quantizer output. The voltage gain from Yxpφ1 to Vop is −Cs/Cf, the ratio of capacitor 330a to capacitor 318a. Thus, the gain of gain element 192 can be set as $k_n$=Cs/Cf.

Figure 8:
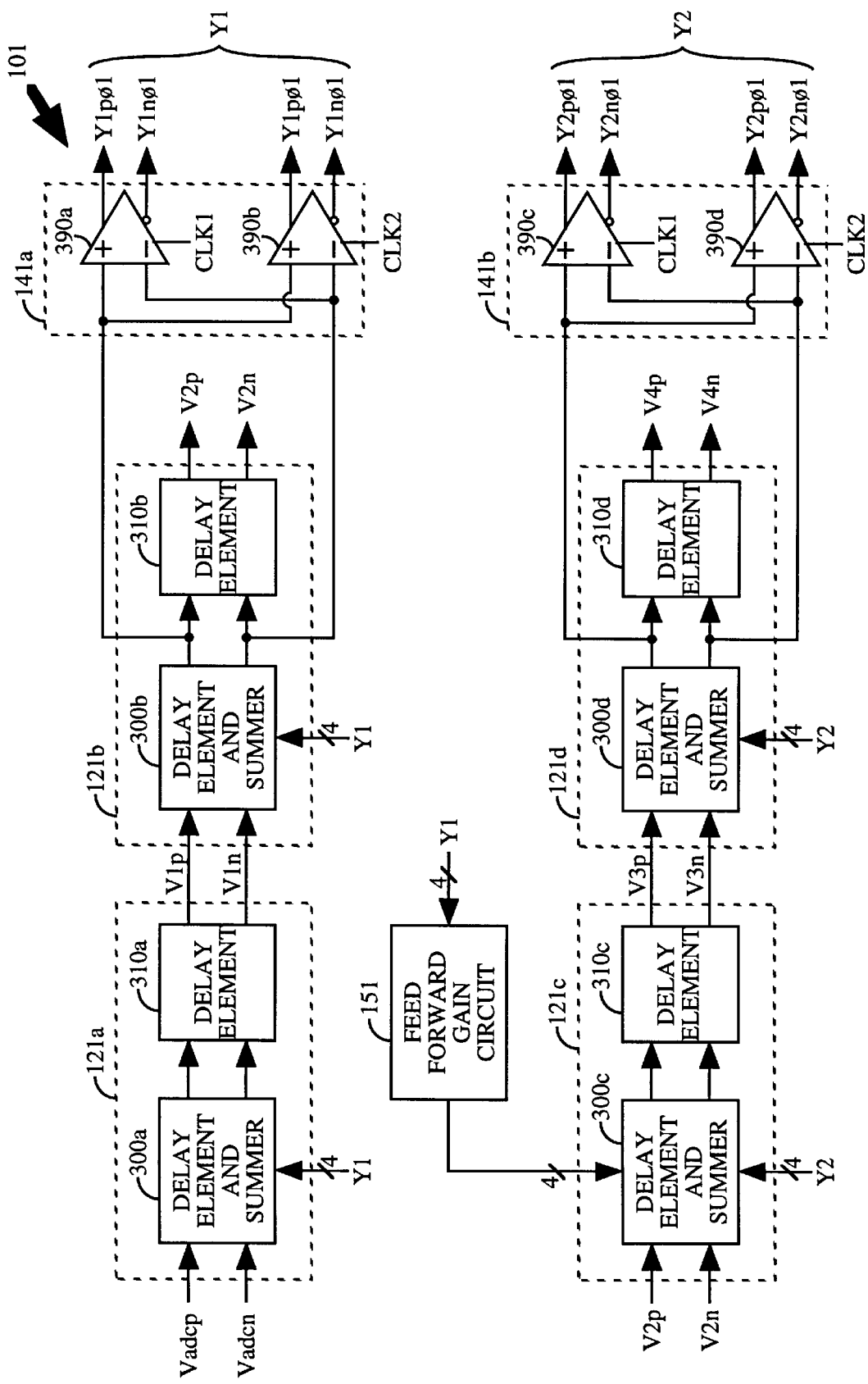
FIG. 8 is a block diagram of an exemplary eighth order bandpass MASH 4-4 ΣΔ ADC of the present invention.

Having implemented each resonator section 120 with resonator circuit 121, MASH ADC 100 in FIG. 4 can be implemented as an eighth order bandpass MASH 4-4 ADC 101 as shown in FIG. 8. Each resonator section 120 in FIG. 4 is replaced with double-sampling switched capacitor resonator circuit 121 in FIG. 8. Within resonator circuit 121, the feedback from delay circuit 310 to circuit 300 is not shown for simplicity. Also, note that noise cancellation logic 160 in FIG. 4 is not shown in FIG. 8 for simplicity.

Quantizer 140a in FIG. 4 is implemented with quantizer 141a which comprises two synchronous comparators 390a and 390b. Comparator 390a is clocked by CLK1 having the first phase φ1 and comparator 390b is clocked by CLK2 having the second phase φ2 (see FIG. 6B). The differential input signals to comparators 390a and 390b are provided by the output of circuit 300b. This is because quantizer 141a has a delay of a half switching clock cycle. The input to quantizer 141a is taken before delay circuit 310b which also provides a delay of a half switching clock cycle. Connected in this manner, quantizer 141a is properly aligned in time. Each comparator 390 provides a differential output. Comparator 390a provides the differential output signals Y1pφ1 and Y1nφ1 and comparator 390b provides the differential output signals Y1pφ2 and Y1nφ2. The four quantizer outputs, collectively referred to as Y1, are provided to circuits 300a, 300b, and 151 as shown by FIGS. 4 and 8.

Referring to FIGS. 4 and 8, feed forward gain element 150 can be incorporated into circuit 300c to simplify the circuit design. Referring to FIG. 4, the gain from the output (V2) of resonator 130b to X2 is $1/k_1k_2G$ and the gain from the output (Y1) of quantizer 140a to X2 is $-h/G$. The overall transfer function of feed-forward gain element 150 can be calculated as X2=Av1·V2−Av2·Y1, where Av1=$1/k_1k_2G$ and Av2=$h/G$.

The gains $k_1$, $k_2$, h, and G of bandpass MASH 4-4 ADC 101 are selected for optimal SNR and ease of circuit implementation. Using mixed analog and digital design simulation tools, the following exemplary values are selected for the gains:

$$k_1=0.5, k_2=0.5, h=2, G=4. \qquad (4)$$

Figure 9:
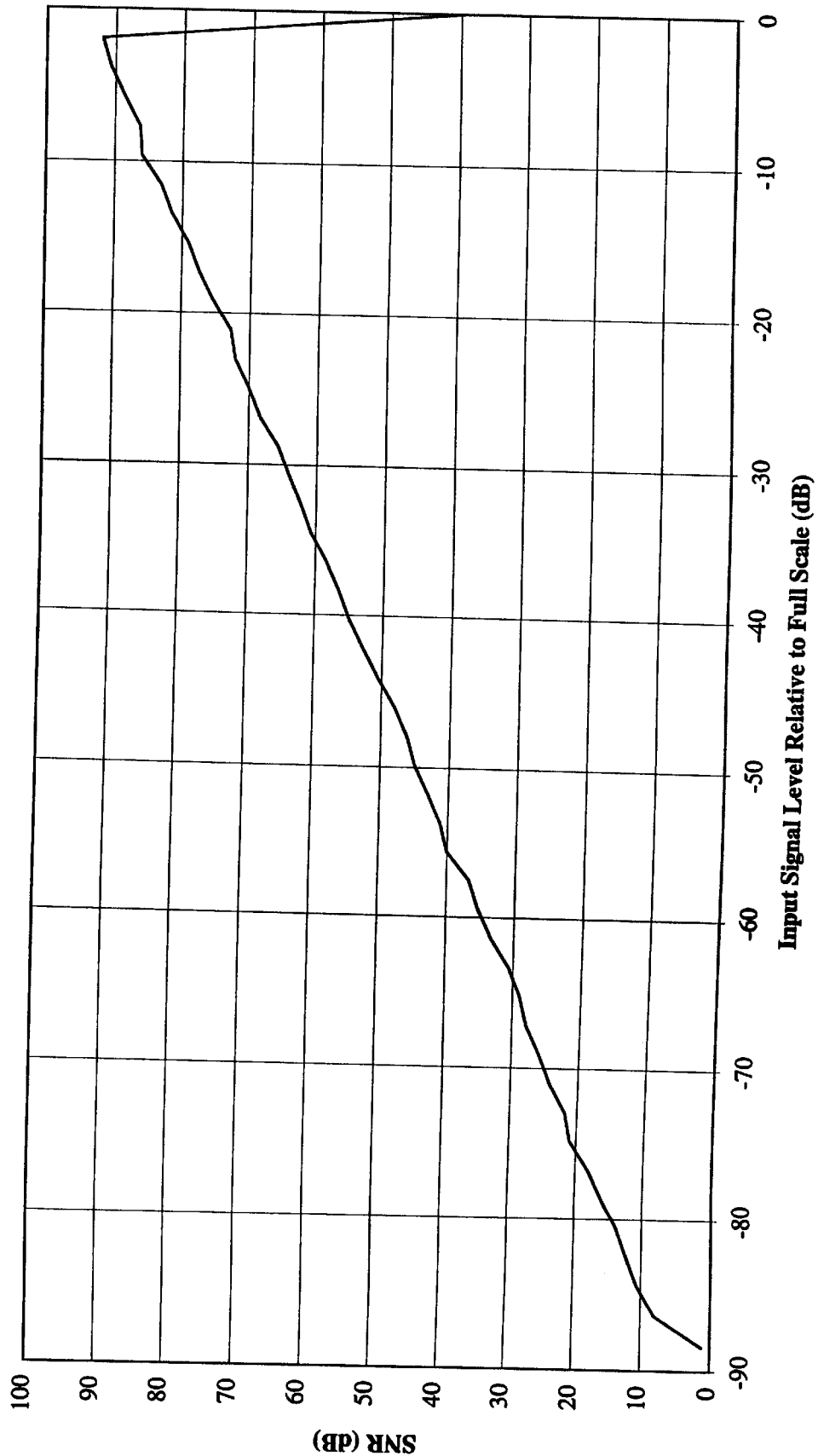
FIG. 9 is a plot of the simulated signal-to-noise ratio (SNR) performance of the bandpass MASH 4-4 ΣΔ ADC of the present invention.

Other values for gains $k_1$, $k_2$, h, and G can also be utilized and are within the scope of the present invention. Using the gain values as shown in equation (4), and an oversampling ratio of 32, the SNR versus input signal level is plotted in FIG. 9. The peak SNR surpasses 90 dB.

Figure 7B:
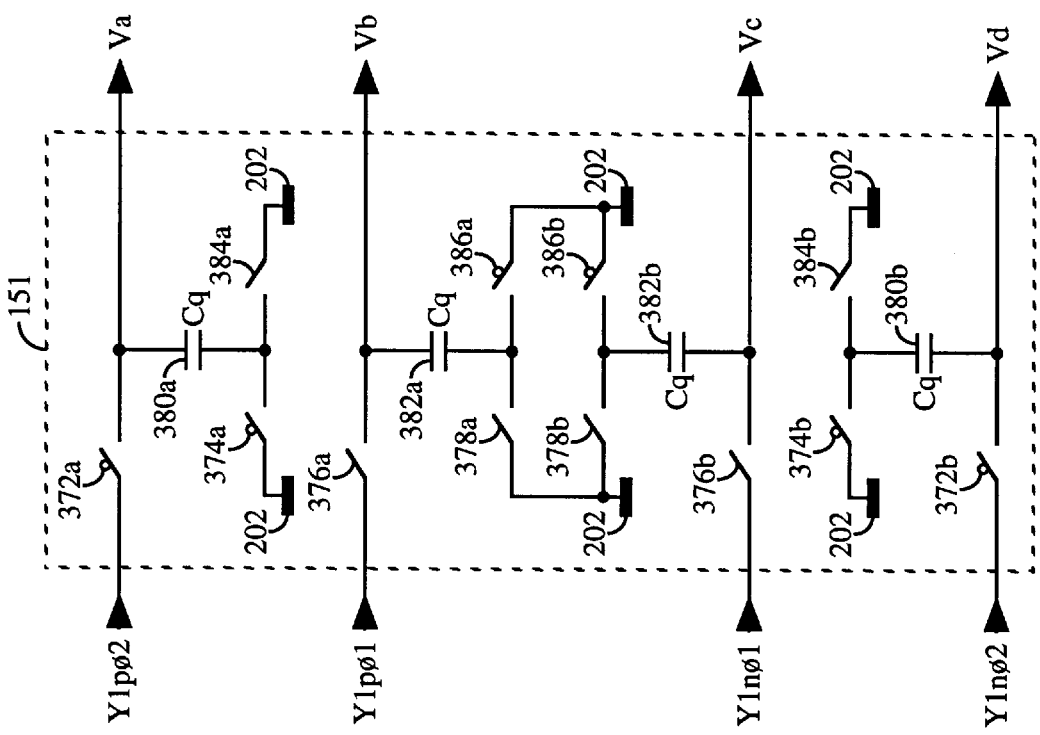

A schematic diagram of an exemplary feed-forward gain circuit 151, which in conjunction with circuit 300c implements feed-forward gain element 150, is illustrated in FIG. 7B. The quantizer outputs Y1p$\phi$2, Y1p$\phi$1, Y1n$\phi$1, and Y1n$\phi$2 from quantizer 141a (see FIG. 8) are provided to switches 372a, 376a, 376b, and 372b, respectively. Switches 372a, 376a, 376b, and 372b connect to one end of capacitors 380a, 382a, 382b, and 380b which are connected to node Va, Vb, Vc, and Vd within resonator circuit 121 in FIG. 7A, respectively. The other end of capacitors 380a, 382a, 382b, and 380b, connect to switches 374a and 384a, 378a and 386a, 378b and 386b, and 374b and 384b, respectively. Switches 374a, 378a, 378b, 374b, 384a, 386a, 386b, and 384b also connect to AC ground 202.

The gain values Av1 and Av2 can be calculated and incorporated into feed forward gain circuit 151. Using the values of $k_1$=0.5, $k_2$=0.5, h=2, and G=4 from equation (4), the gain values become Av1=1.0 and Av2=0.5. Referring to FIGS. 7A and 7B, the gain from the output Y1p$\phi$1 of quantizer 141a to the non-inverting output of amplifier 350a is determined by the ratio of capacitors 382a and 318a, or Av2=Cq/Cf=0.5. Therefore, the capacitance of capacitor 382a is synthesized to be half of the value of capacitor 318a.

Referring to FIG. 8, the gain from the output V2p of resonator circuit 121b (corresponding to Vip in FIG. 7A) to the non-inverting output of amplifier 350a is determined by the ratio of capacitors 330a and 318a, or Av1=Cs/Cf=1.0. Thus, the value of capacitor 330a is synthesized to be the same capacitance as capacitor 318a. However, capacitors 330a and 318a also implement gain element 192 (see FIG. 5B). In the exemplary embodiment, the gains kn=$k_1$=$k_2$=0.5 as shown in equation (4). Therefore, capacitor 330a is selected to be half the capacitance of capacitor 318a.

In the exemplary embodiment, noise cancellation circuit 160 in FIG. 4 is implemented in digital logic. For an eighth order bandpass MASH $\Sigma\Delta$ ADC, delay element 172 has a transfer function of $z^{-4}$ and can be implemented with four D flip-flops connected in cascade, the design and implementation of which are known in the art. The transfer function of element 168 is $N(z)=(1+z^{-2})^2$ which can be implemented with two summers and four sets of D flip-flops, the implementation of which is also known in the art.

As stated above, double-sampling switched capacitor circuits are sensitive to path mismatch. However, path mismatch in the stages subsequent to the first sampling stage is noise shaped and does not cause a noticeable image. Referring to FIG. 8, within delay element and summer circuit 300a, which is illustrated in FIG. 7A, only the input sampling capacitors 328 and 330 are sensitive to mismatch in capacitor values and only input sampling switches 320, 322, 324, and 326 are sensitive to uneven clock phases of the switching clocks. Path mismatch can be minimized by the use of circuit design techniques described below.

Referring to FIG. 3D, bandpass MASH 4-4 ADC 101 provides noise shaping of the quantization noise such that the spectral components around fs/4 is pushed toward DC and fs/2. For optimal performance, the input signal being sampled should be placed close to fs/4. For undersampling applications, wherein the input signal is centered at an IF which is higher than the sampling frequency and the aliasing property of sampling is used to downconvert the input signal from IF to a lower frequency, the input signal should be placed close to IF=(2n+1)·fs/4, where n is an integer greater than or equal to zero.

V. Alternative Bandpass Resonator Design

A bandpass resonator can be synthesized by various other structures, three of which are illustrated in FIGS. 5C–5E. In the exemplary embodiment, lossless discrete integrator (LDI) resonator 132 in FIG. 5C is implemented with single-sampling switched capacitor LDI resonator circuit 402 in FIG. 10A, Forward-Euler (FE) resonator 133 in FIG. 5D is implemented with single-sampling switched capacitor FE resonator circuit 403 in FIG. 10B, and two-path interleaved resonator 134 in FIG. 5E is implemented with pseudo two-path switched capacitor resonator circuit 502 in FIG. 10C and two independent path resonator circuit 503 in FIGS. 10E–10F. These are exemplary implementations of resonators 132, 133 and 134. Other implementations utilizing the circuit techniques listed in Table 2 are within the scope of the present invention.

Figure 10A:
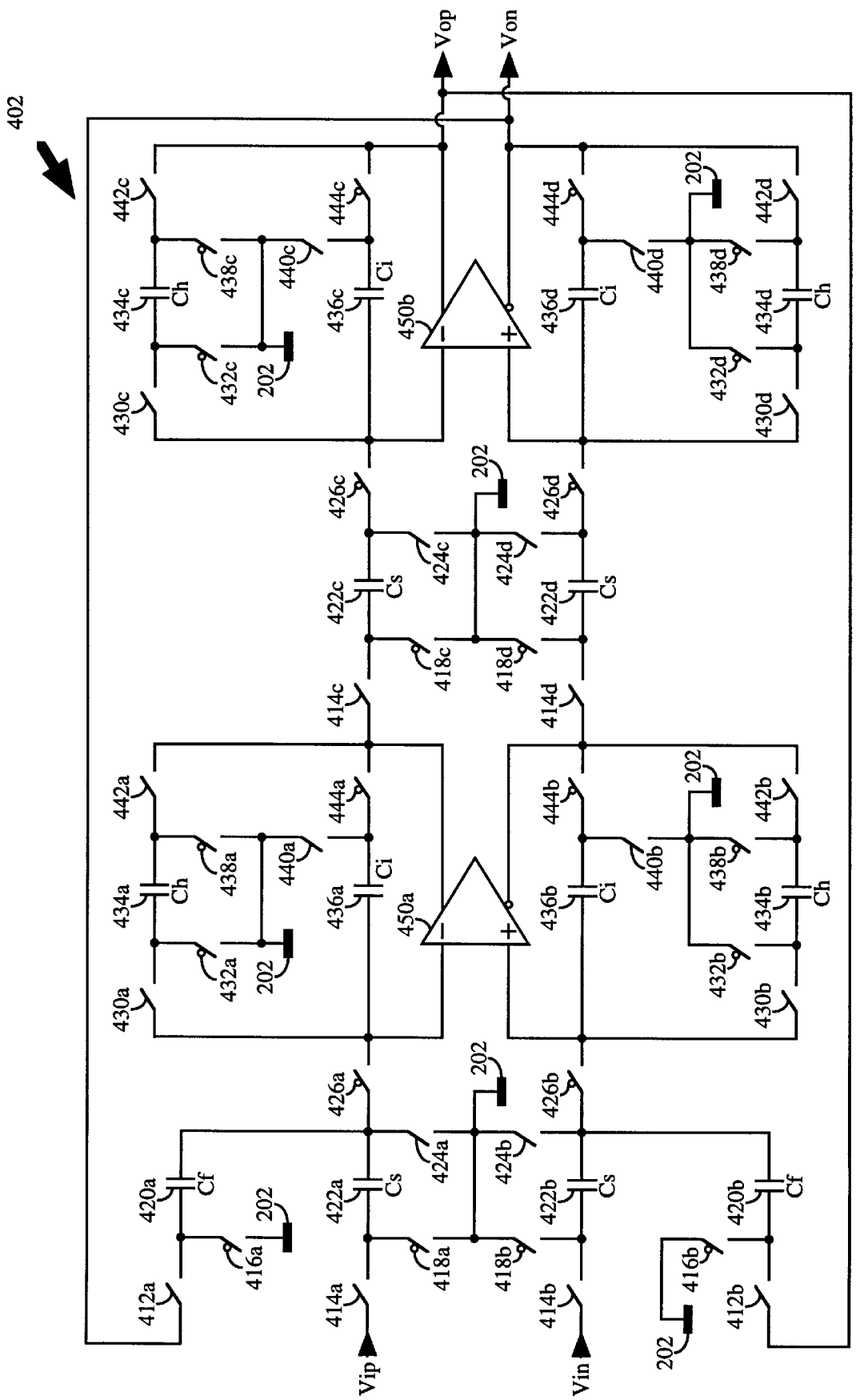
FIGS. 10A–10B are exemplary schematic diagrams of a delay cell based resonator and a Forward-Euler resonator, respectively, both implemented using single-sampling switched capacitor analog circuit technique.

An implementation of delay cell based resonator 132 using single-sampling switched capacitor circuit is shown in FIG. 10A. Within the first section of LDI resonator circuit 402, the input signal Vip is provided to switch 414a. Switch 414a connects to one end of capacitor 422a and switch 418a. The other end of capacitor 422a connects to switches 424a and 426a. Switches 418a and 424a also connect to AC ground 202. Switches 426a and 430a and one end of capacitor 436a connect to the inverting input of amplifier 450a. The other end of capacitor 436a connects to switches 440a and 444a. Switch 440a also connects to AC ground 202 and switch 444a also connects to the non-inverting output of amplifier 450a. Switch 430a also connects to switch 432a and one end of capacitor 434a. The other end of capacitor 434a connects to switches 438a and 442a. Switches 432a and 438a also connect to AC ground 202 and switch 442a also connects to the non-inverting output of amplifier 450a.

A second section identical to the first second is connected in cascade with the first section. The output of the second section is fed back to the first section. The inverting output of amplifier 450b connects to switch 412a. Switch 412a also connects to switch 416a and one end of capacitor 420a. Switch 416a also connects to AC ground 202. The other end of capacitor 420a connects to switches 424a and 426a. LDI resonator circuit 402 is a fully differential circuit. The lower half of LDI resonator circuit 402 is a mirror image of the upper half. The output of amplifier 450b comprises the output of resonator circuit 402.

LDI resonator circuit 402 is clocked at the sampling frequency. LDI resonator circuit 402 has a resonant frequency that is a function of the sampling frequency and the capacitor ratios. The transfer function of LDI resonator circuit 402 is:

$$H_{LDI}(z) = \frac{z^{-1}}{1 + (2 - \beta)z^{-1} + z^{-2}}, \quad (5)$$

where Cs=Ch=Ci and β=Cf/Cs. By changing β, the zeros of the noise transfer function H(z) for a ΣΔ ADC utilizing LDI resonators can be spread about fs/4. LDI resonator circuit 402 is not effective for oversampling ratio of greater than 16 because of sensitivity to capacitor mismatch.

Figure 10B:
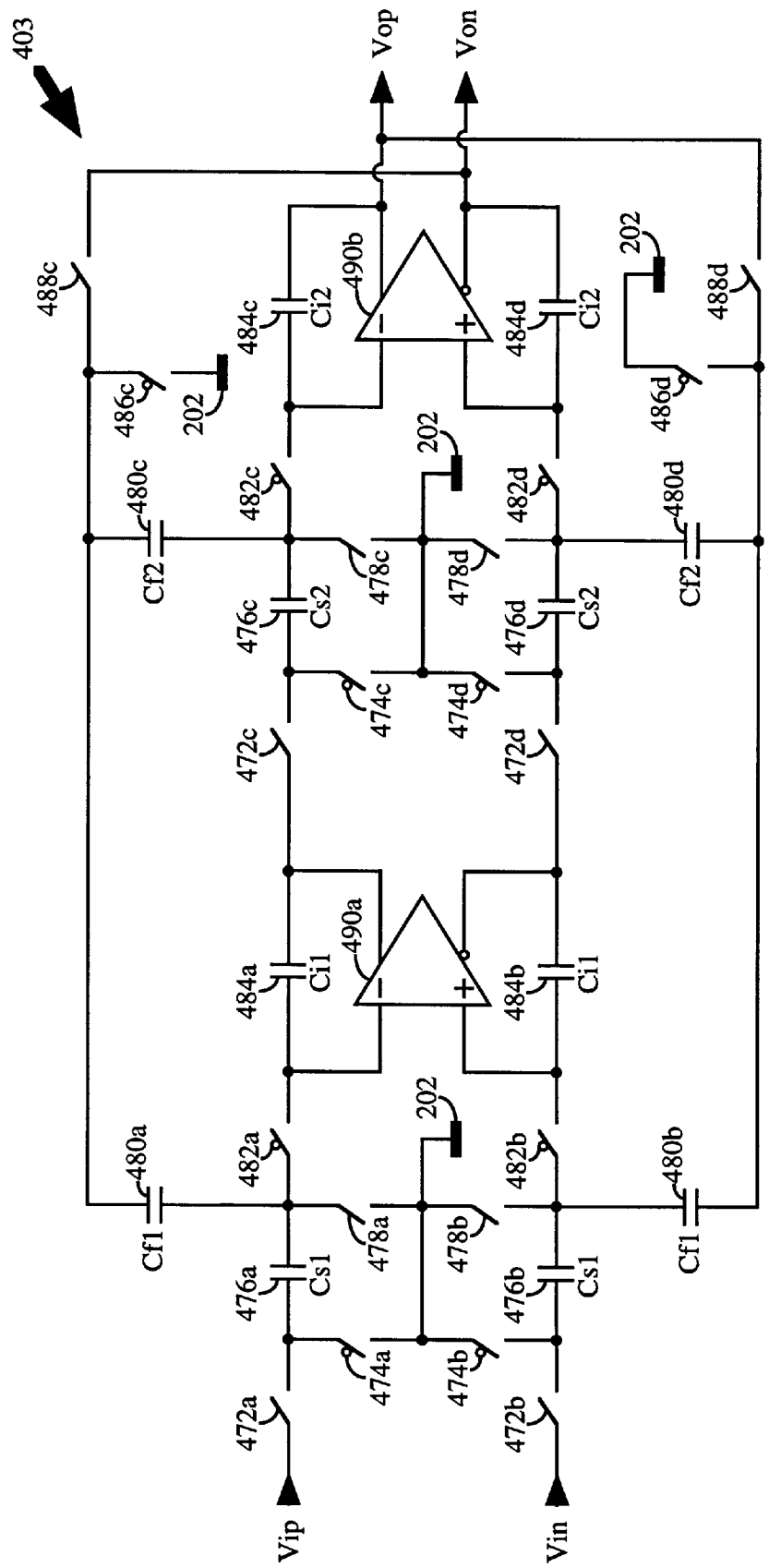

An implementation of FE resonator 133 using single-sampling switched capacitor circuit is shown in FIG. 10B. Within the first section of FE resonator circuit 403, the input signal Vip is provided to switch 472a. Switch 472a connects to one end of capacitor 476a and switch 474a. The other end of capacitor 476a connects to switches 478a and 482a and one end of capacitor 480a. Switches 474a and 478a also connect to AC ground 202. Switch 482a also connects to the inverting input of amplifier 490a. Capacitor 484a connects to the inverting input and the non-inverting output of amplifier 490a.

A second section identical to the first section is connected in cascade with the first section. The output of the second section is fed back to the first section. The inverting output of amplifier 490b connects to switch 488c. Switch 488c connects to switch 486c and the other end of capacitors 480a and 480c. Switch 486c also connects to AC ground 202. FE resonator circuit 403 is a fully differential circuit. The lower half of FE resonator circuit 403 is a mirror image of the upper half. The output of amplifier 490b comprises the output of resonator circuit 403.

FE resonator circuit 403 is clocked at the sampling frequency. FE resonator circuit 403 has a resonant frequency that is a function of the sampling frequency and the capacitor ratios. The transfer function of FE resonator circuit 403 is:

$$H_{FE}(z) = \frac{z^{-2}}{1 + (2 - \beta)z^{-1} + z^{-2}}, \quad (6)$$

where Cf1=Cf2=Cf, Cs1=Cs2=Ci1=Ci2=Ci, and β=Cf/Ci. By changing β, the zeros of the noise transfer function H(z) for a ΣΔ ADC utilizing FE resonators can be spread about fs/4. FE resonator circuit 403 has a faster settling time than LDI resonator circuit 402.

Figures 10C, 10D:
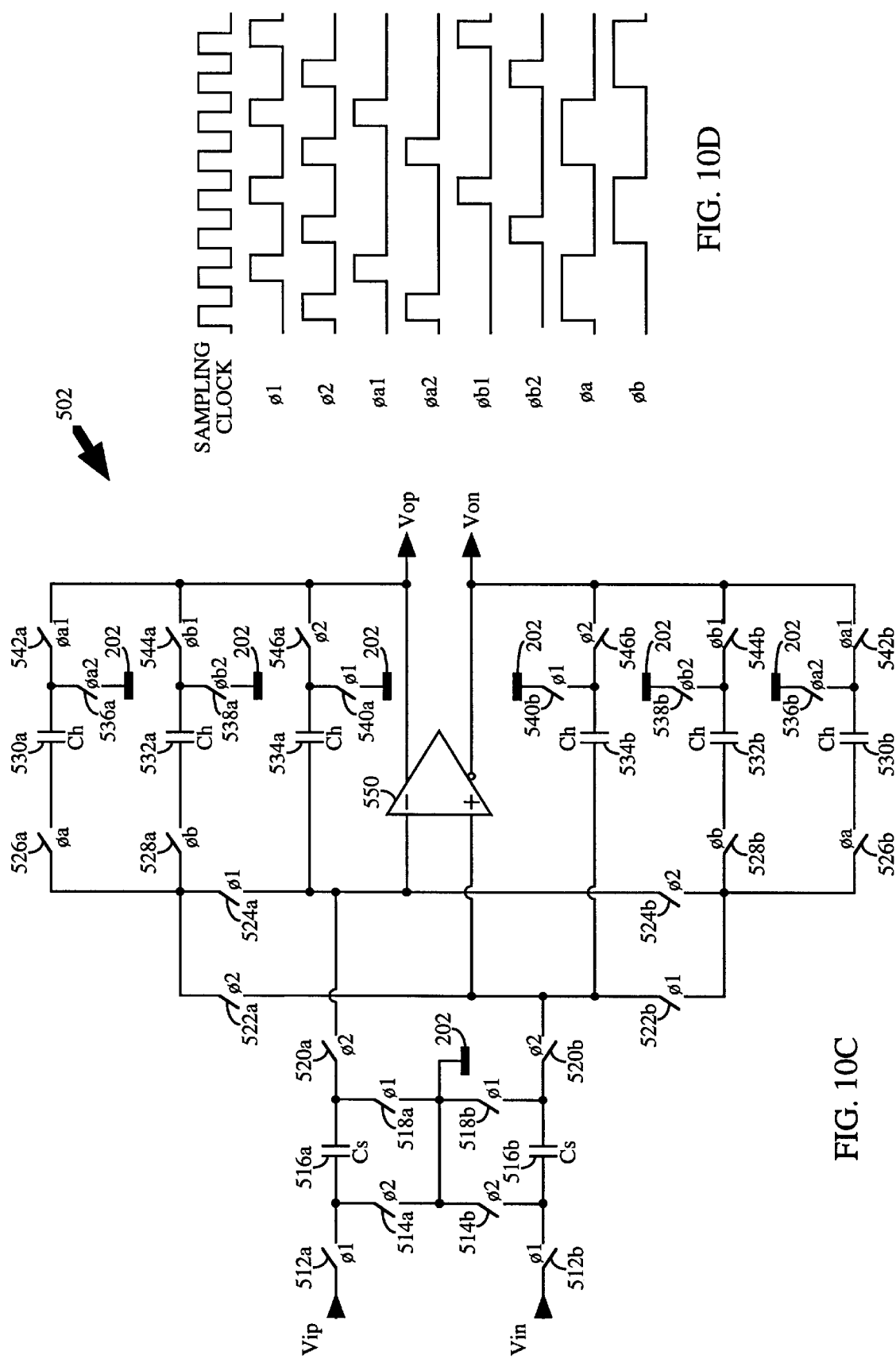
FIGS. 10C–10D are exemplary schematic diagrams of a two-path interleaved resonator implemented using pseudo two-path single-sampling switched capacitor analog circuit and the timing diagram of the required clock signals for the pseudo two-path circuit, respectively.

An implementation of two-path interleaved resonator 134 using pseudo two-path single-sampling switched capacitor circuit is shown in FIG. 10C. Within resonator circuit 502, the input signal Vip is provided to switch 512a. Switch 512a connects to one end of capacitor 516a and switch 514a. The other end of capacitor 516a connects to switches 518a and 520a. Switches 514a and 518a also connect to AC ground 202. Switches 520a and 524a and one end of capacitor 534a connect to the inverting input of amplifier 550. The other end of capacitor 534a connects to switches 540a and 546a. Switch 540a also connects to AC ground 202 and switch 546a also connects to the non-inverting output of amplifier 550. Switch 524a also connects to switches 522a, 526a, and 528a. Switch 522a also connects to the non-inverting input of amplifier 550. Switches 526a and 528a also connect to one end of capacitors 530a and 532a, respectively. The other end of capacitor 530a connects to switches 536a and 542a. The other end of capacitor 532a connects to switches 538a and 544a. Switches 536a and 538a also connect to AC ground 202 and switches 542a and 544a also connect to the non-inverting output of amplifier 550. Resonator circuit 502 is a fully differential circuit. The lower half of resonator circuit 502 is a mirror image of the upper half. The output of amplifier 550 comprises the output of resonator circuit 502.

Resonator circuit 502 is clocked at the sampling frequency. Resonator circuit 502 has a resonant frequency that is a function of the sampling frequency and the capacitor ratios. The advantage of resonator circuit 502 is that only one amplifier 550 is required for two delays. The disadvantages are the needs for eight clock phases and the need to operate resonator circuit 502 at the sampling frequency. The required clock signals for resonator circuit 502 are shown in FIG. 10D. The transfer function of resonator circuit 502 is:

$$H_{PTP}(z) = \frac{C_s}{C_h} \cdot \frac{z^{-2}}{1 + z^{-2}}. \quad (7)$$

Figures 10E, 10F:
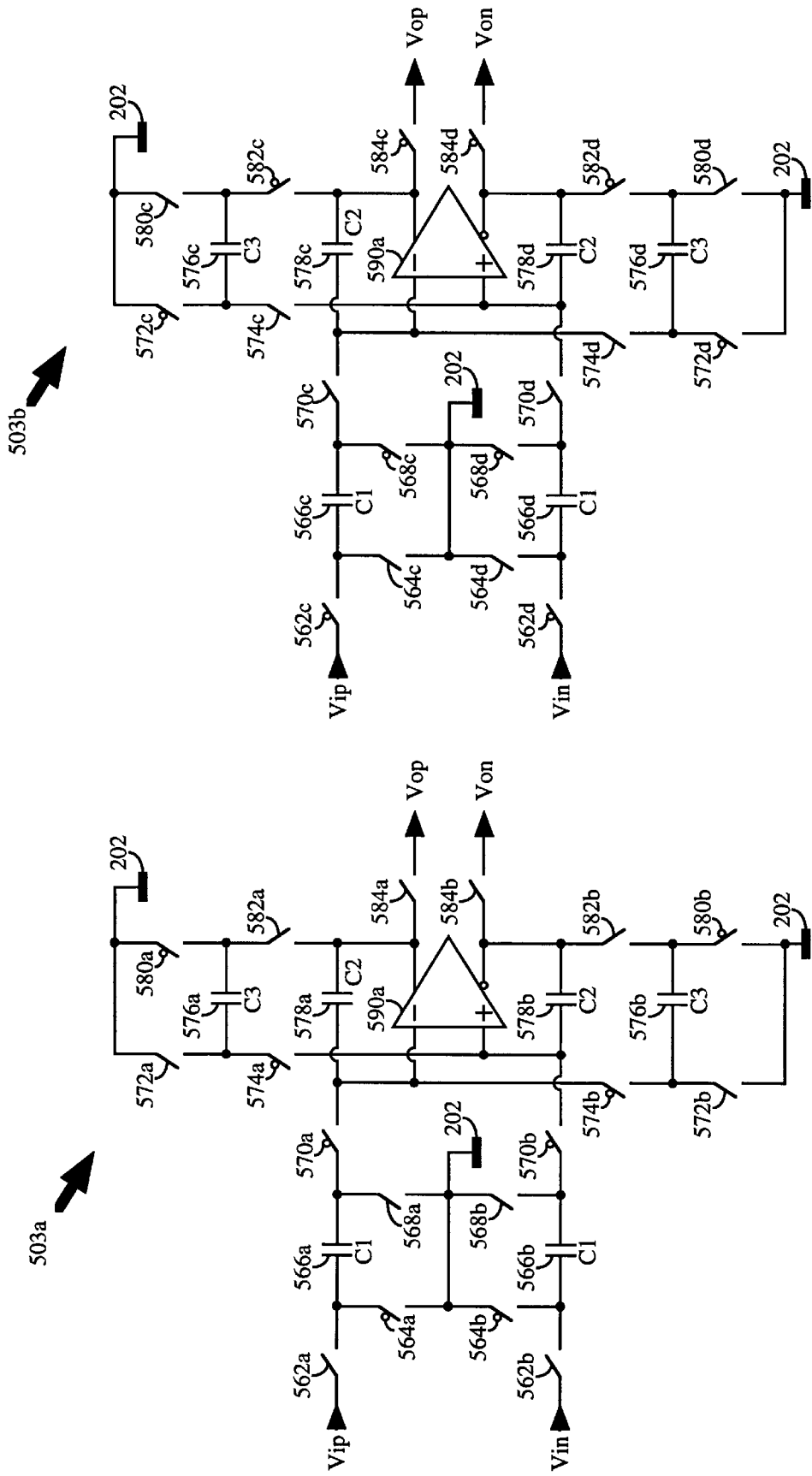
FIGS. 10E–10F are exemplary schematic diagrams of a two-path interleaved resonator implemented using two independent path double-sampling switched capacitor analog circuits.

Two-path interleaved resonator 134 can also be implemented using two independent path single-sampling switched capacitor circuit as shown in FIGS. 10E–10F. Within resonator circuit 503a, the input signal Vip is provided to switch 562a. Switch 562a connects to one end of capacitor 566a and switch 564a. The other end of capacitor 566a connects to switches 568a and 570a. Switches 564a and 568a also connect to AC ground 202. Switch 570a and one end of capacitor 578a connect to the inverting input of amplifier 590a. The other end of capacitor 578a connects to the non-inverting output of amplifier 590a. Switch 574a connects to the non-inverting input of amplifier 590a. Switch 574a also connects to switch 572 and one end of capacitor 576a. The other end of capacitor 576a connects to switches 580a and 582a. Switches 572a and 580a also connect to AC ground 202. Switch 582a also connects to the non-inverting output of amplifier 590a. The non-inverting output of amplifier 590a connects to switch 584a. The other end of switch 584a comprises the output signal Vop.

Resonator circuit 503a is a fully differential circuit. The lower half of resonator circuit 503a is a mirror image of the upper half. Resonator circuit 503a comprises one signal path of the input signal. An identical resonator circuit 503b comprises the second signal path. Resonator circuit 503b is connected in the same manner as resonator circuit 503a but the switches operate on the alternative clock phases.

Resonator circuit 503 is clocked at half the sampling frequency. Resonator circuit 503 has a resonant frequency that is a function of the sampling frequency and the capacitor ratios. Resonator circuit 503 has a fast settling time. However, because of the two independent paths, path matching is more difficult to maintain. The transfer function of resonator circuit 503 is:

$$H_{TIP}(z) = \frac{C_1}{C_3} \cdot \frac{z^{-2}}{1 + z^{-2}}. \quad (8)$$

VI. Multi-Sampling Bandpass Resonator Design

Figures 10G, 10H:
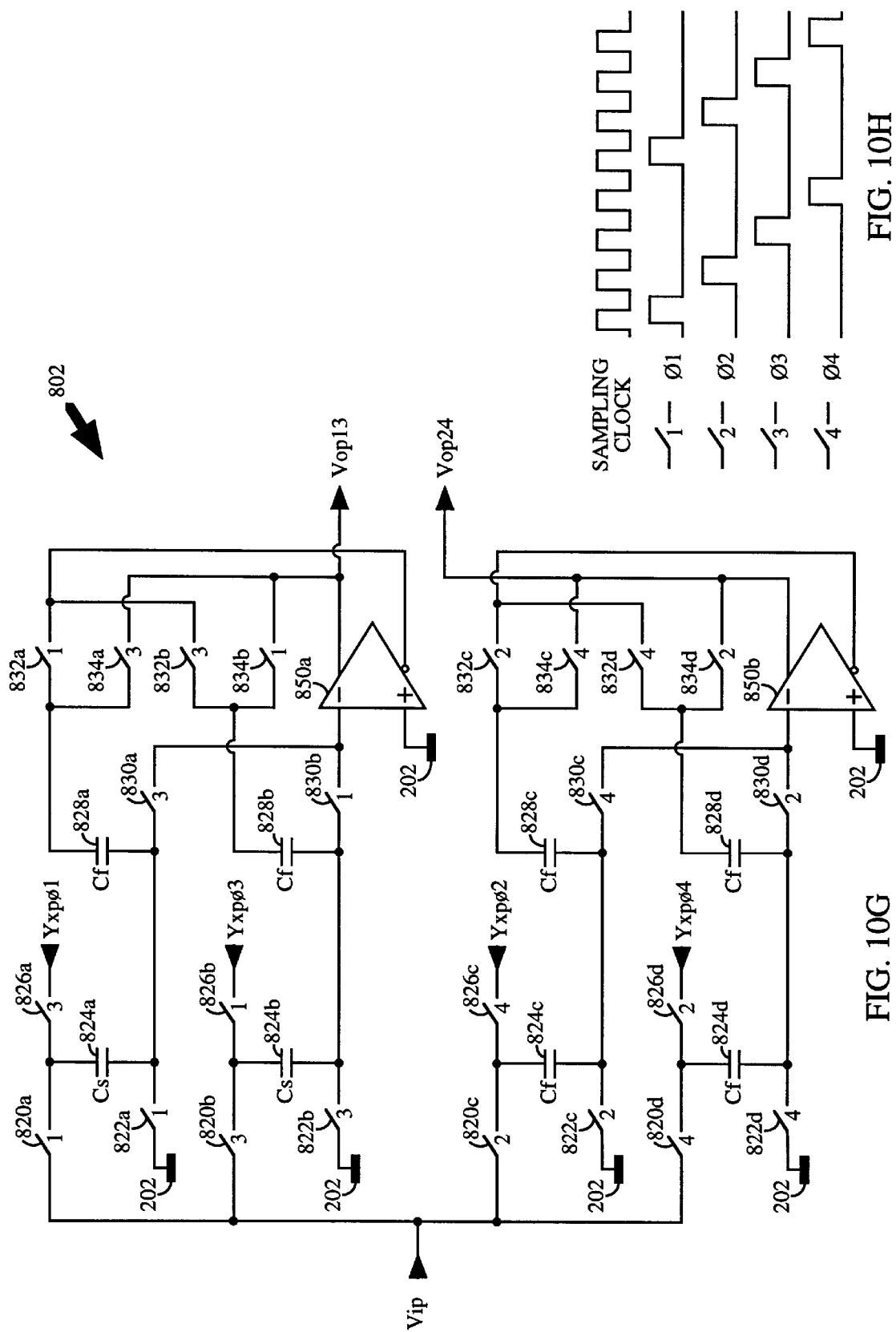
FIGS. 10G–10H are exemplary schematic diagrams of a double-sampled delay cell based resonator circuit and timing diagram of the required clock signals for the resonator circuit, respectively.

The double-sampling switched capacitor bandpass resonator circuit of the present invention can be further expanded to multi-sampling resonator circuits. A schematic diagram of an exemplary quadruple-sampling switched capacitor resonator circuit 802 is illustrated in FIG. 10G. FIG. 10G only illustrates the upper half of resonator circuit 802. The lower half, to which the Vin of the differential input is applied, is identical to the upper half and not shown for simplicity.

Within resonator circuit 802, the input signal Vip is provided to four signal paths, the first signal path through switch 820a. Switch 820a connects to one end of capacitor 824a and switch 826a. Switch 826a connects to the quantizer output Yxp$\phi$1. The other end of capacitor 824a connects to switches 822a and 830a and one end of capacitor 828a. Switch 822a also connects to AC ground 202 and switch 830a also connects to the inverting input of amplifier 850a. The other end of capacitor 828a connects to switches 832a and 834a. Switch 832a also connects to the non-inverting output of amplifier 850a and switch 834a also connects to the inverting output of amplifier 850a.

The operation of the first signal path in resonator circuit 802 can be described as follows. During the first clock phase φ1, switches 820a and 822a are switched ON and capacitor 824a is charged with the input signal Vip. during the third clock phase φ3, switches 820a and 822a are switched OFF and switches 826a, 830a, and 834a are switched ON. The signal Yxpφ1 and the voltage across capacitor 824a are scaled by the ratio of capacitors 824a and 828a (Cs/Cf) and provided to the non-inverting output of amplifier 850a. Also during the first clock phase φ1, switch 832a is switched ON and the signal from the inverting output of amplifier 850a is fed back, charging capacitor 828a. The voltage across capacitor 828a is reflected at the non-inverting output of amplifier 850a during the third clock phase φ3. The non-inverting output from amplifiers 850a and 850b comprises the outputs Vop13 and Vop23, respectively, which are provided to the next resonator section.

The other three signal paths are connected in similar manner as shown in FIG. 10G. The other three signal paths also operate in similar manner as the first signal path. However, the switches in the other three signal paths are switched with switching clocks having different phases as shown in FIG. 10H. Thus, each switch in resonator circuit 802 is switched ON and OFF every four sampling clock cycles. This allows amplifiers 850 more time to settle to the final value. Viewed in another way, an amplifier having a specified performance can be used to implement a ΣΔ ADC which is effectively sampled at four time the switching frequency. However, path mismatch due to mismatch in capacitor values, uneven clock phases of the switching clocks, and amplifier mismatch can cause images to appear the ADC output.

VII. Minimizing Power Consumption

In many applications, such as CDMA communication system, power consumption is an important design consideration because of the portable nature of the telephone wherein the ΣΔ ADC of the present invention reside. The ΣΔ ADC can be designed to minimize power consumption by allowing for selective sections of the ΣΔ ADC to be disabled when high dynamic range is not required. In addition, the ΣΔ ADC can be designed to allow for adjustment of the bias current based on the signal level of the ADC input and the required performance.

In the exemplary embodiment, the ΣΔ ADC provides 12-bits of resolution. This design anticipates the worse case signal level into the ΣΔ ADC. For CDMA applications, approximately 4-bits of resolution is needed for the desired signal (e.g. the CDMA signal) and the remaining 8-bits of resolution are reserved for spurious signals of large amplitude (or jammers) and for AGC control. In the exemplary embodiment, the 12-bits of resolution is provided by a two-loop MASH 4-4 architecture. Referring to FIG. 4, loop 110a provides high dynamic range and a low noise floor. Loop 110b provides additional dynamic range but has a slightly higher noise floor than loop 110a. The lower noise floor of loop 110a is the result of having larger capacitors and biasing the amplifiers within loop 110a with higher bias current.

In the present invention, each loop can be selectively disabled, based on the signal level of the ADC input and the required performance, to minimize power consumption. Furthermore, the bias current of the amplifier within each resonator 130 can be adjusted based on the signal level of the ADC input and the required performance. When high dynamic range is required, the ADC input is provided to loop 110a, the bias current of all amplifiers is set high, and MASH ADC 100 operates in the manner described above. This situation may result from an ADC input comprising the CDMA signal and two large jammers at +58 dBc or an ADC input comprising the CDMA signal and one large jammer at +72 dBc. These requirements are specified by the "TIA/EIA/IS-98-A Intermodulation Spurious Response Attenuation", hereinafter the IS-98-A standard. In practice, this situation occurs infrequently.

As the jammer amplitude decreases, high dynamic range is not required. When this occurs, loop 110b can be disabled and the output Y1 from loop 110a comprises the ΣΔ ADC output. Alternatively, loop 110a can be disabled, the ADC input can be provided to loop 110b, and the output Y2 from loop 110b comprises the ΣΔ ADC output. Thus, one to two loops can be enabled to provide the required dynamic range.

The bias current of the amplifier in each resonator 130 can be adjusted to minimize power consumption while providing the required performance. In the exemplary embodiment, loop 110a is designed to consume a maximum of 10 mA of bias current and second loop 110b is designed to consume a maximum of 8 mA of bias current. In the exemplary embodiment, within loop 110a, the amplifier within resonator 130a is designed to consume 6 mA and the amplifier within resonator 130b is designed to consume 4 mA. When high dynamic range is required, the bias current for each amplifier is set high. When high dynamic range is not required, the bias current can be decreased. For example, the bias current of the amplifier within resonator 130a can be decreased from 6 mA down to 2 mA and the bias current of the amplifier within resonator 130b can be decreased from 4 mA down to 2 mA. Similarly, the bias current for the amplifiers within loop 110b and be decreased accordingly when high dynamic range is not required.

Adjustment of the amplifier bias current can be performed independently of the disablement of the loops, or can be performed in conjunction with the disablement of the loops. In fact, analysis and measurements can be performed to ascertain the dynamic range of various configurations of the ΣΔ ADC. Then, based on the required dynamic range, the ΣΔ ADC can be configured accordingly. The various methods used to configure the ΣΔ ADC to minimize power consumption are within the scope of the present invention.

In the exemplary embodiment, the required dynamic range can be estimated by measuring the power level of the desire signal (e.g. the CDMA signal) and the power level of the ADC input. The power level of the ADC input can be measured by a power detector. The power detector can be implemented in the manner known in the art. The power level of the desired signal can be measured by computing the RSSI of the desired signal, after the digital signal processing to remove undesirable images and spurious signals. The RSSI measurement is described in detail in U.S. Pat. No. 5,107,225, entitled "HIGH DYNAMIC RANGE CLOSED LOOP AUTOMATIC GAIN CONTROL CIRCUIT", issued Apr. 21, 1992, assigned to the assignee of the present invention and incorporated by reference herein. Alternatively, the required dynamic range can be determined based on the operating mode of the receiver wherein the ΣΔ ADC reside.

VIII. Other Considerations

Double-sampling switched capacitor circuits for the ΣΔ ADC of the present invention are sensitive to path mismatch which can result from mismatch in capacitor values and/or uneven phases of the switching clocks. Capacitor mismatch can be reduced to less than one percent by utilizing circuit design techniques which are known in the art, such as the common centroid layout technique.

Double-sampling switched capacitor circuits sample the signal on two phases of the switching clock. The switching clock is a divide-by-two of the sampling clock (see FIG. 6B). If the divide-by-two causes any phase asymmetry, the phase mismatch causes an image of the input signal to appear at the output. Using the master clock, e.g. the sampling clock, before the divide-by-two operation, to clock the first sampling stage (switches 320, 322, 324, and 326 in FIG. 7A) will resolve this problem.

Clock jitter in the first sampling stage is also critical. Clock jitter translates to quantization noise. Clock jitter can be reduced by clocking the first sampling stage with a clean external clock source. For undersampling application wherein the ADC is used to downconverts a signal at IF down to a lower frequency, the jitter spectral density is increased by the square of the undersampling ratio. For example, for an IF of 220 MHz and a sampling rate of 80 MHz, the phase noise is increased by 8.8 dB [20 log(220 MHz/80 MHz)]. For undersampling applications, the clock jitter requirement is more stringent.

The ΣΔ ADC of the present invention has been described in detail for a bandpass MASH 4-4 ΣΔ ADC which is implemented with double-sampling switched capacitor circuits. The circuit design techniques described above can also be applied to a single-loop ΣΔ ADC architecture which is shown in FIG. 1. Thus single-loop ΣΔ ADCs are within the scope of the present invention.

A baseband ΣΔ ADC can be designed by implementing the filters in FIGS. 1–2 with a lowpass filter. For example, a baseband MASH 2-2 ADC can be designed by substituting resonators 130 in FIG. 4 with integrators having the lowpass transfer function $$\frac{z^{-1}}{1-z^{-1}}.$$

Thus, baseband single-loop and MASH ΣΔ ADCs are within the scope of the present invention.

The filters in the ΣΔ ADCs of the present invention can be implemented with various analog circuit design techniques, including active RC, gm-C, MOSFET-C, switched capacitor, and switched current. Furthermore, the switched capacitor and switched current circuits can be single-sampling, double-sampling, or multi-sampling designs.

Therefore, the various combinations and permutations of bandpass and baseband ΣΔ ADC implemented with single-loop and MASH architectures which are synthesized with active RC, gm-C, MOSFET-C, switched capacitor, or switched current utilizing single-sampling, double-sampling, or multi-sampling designs are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:
1. A sigma-delta analog-to-digital converter comprising:
a plurality of loops coupled in cascade, wherein each loop is implemented with multi-sampling circuitry, said multi-sampling circuitry configured to implement filter functions and to sample a respective loop input signal at multiple phases of a clock signal;
at least one feed-forward gain element, one gain element coupled between each pair of sequential loops; and
a noise cancellation logic coupled to each of said plurality of loop, said noise cancellation logic providing a converter output.
2. The converter of claim 1 wherein each loop comprises:
at least one filter section, said at least one filter section coupled in cascade; and
a quantizer coupled to a last filter section and to each of said at least one filter section.
3. The converter of claim 2 wherein each filter section comprises a resonator section.
4. The converter of claim 3 wherein each resonator section comprises:
a summer coupled to said quantizer;
a resonator coupled to said summer.
5. The converter of claim 1 wherein each loop includes at least one resonator, each resonator implemented as a delay cell based resonator, a lossless discrete integrator resonator, a Forward-Euler resonator, or a two-path interleaved resonator.
6. The converter of claim 1 wherein said multi-sampling circuitry is synthesized with an analog circuit technique selected from the group consisting of active-RC, gm-C, MOSFET-C, switched capacitor, and switched current.
7. The converter of claim 5 wherein said at least one resonator is implemented using double-sampling switched capacitor circuits.
8. The converter of claim 1 wherein each loop includes at least one delay cell resonator, each delay cell resonator comprises:
a gain element;
a summer coupled to said gain element;
a first delay element coupled to said summer; and
a second delay element coupled to said first delay element and said summer.
9. The converter of claim 8 wherein each delay element is implemented with a switched capacitor delay circuit.
10. The converter of claim 1 wherein said multi-sampling circuitry comprises double-sampling switched capacitor circuits that samples a respective loop input signal at alternative phases of a clock signal.
11. The converter of claim 1 wherein said multi-sampling circuitry comprises quadruple-sampling switched capacitor circuits.
12. The converter of claim 1 wherein each loop comprises:
at least one resonator section; and
a quantizer coupled to a last resonator section and to each of said at least one resonator section.
13. The converter of claim 12 wherein said resonator is selected from the group consisting of delay cell based resonator, lossless discrete integrator resonator, Forward-Euler resonator, and two-path interleaved resonator.
14. The converter of claim 13 wherein said resonator is synthesized with an analog circuit technique selected from the group consisting of active-RC, gm-C, MOSFET-C, switched capacitor, and switched current.

15. The converter of claim 12 wherein each resonator section is implemented using double-sampling switched capacitor circuits.

16. The converter of claim 12 wherein each resonator section is implemented using multi-sampling switched capacitor circuits.

17. A sigma-delta analog-to-digital converter comprising:

a plurality of loops coupled in cascade, each loop including at least one delay circuit, wherein each delay circuit comprises an amplifier and two or more signal paths, each signal path comprising:

a first switch;

a capacitor coupled to said first switch;

a second switch coupled to said capacitor and an AC ground;

a third switch coupled to said first switch and an output of said amplifier; and a fourth switch coupled to said second switch and an input of said amplifier;

wherein each signal path in a particular delay circuit is clocked by a set of clock signals having clock phases unique from those of other signal paths in the particular delay circuit.

18. A sigma-delta analog-to-digital converter comprising:

a plurality of loops coupled in cascade, each loop including at least one delay cell and summer circuit, wherein each delay cell and summer circuit comprises an amplifier and two or more signal paths, each signal path comprising:

a first switch;

a first capacitor coupled to said first switch;

a second switch coupled to said first capacitor and said AC ground;

a third switch coupled to said first switch and said output of said loop in which said delay cell and summer circuit reside;

a second capacitor coupled to said first capacitor;

a fourth switch coupled to said second switch and an inverting input of said amplifier;

a fifth switch coupled to said second capacitor and said n-inverting output of said amplifier; and a sixth switch coupled to said second capacitor and an inverting output of said amplifier within said delay circuit of said resonator section.

19. The converter of claim 18 wherein amplifiers within said delay cell and summer circuits are selected from the group consisting of telescopic amplifier, folded-cascade amplifier, and two-stage pole splitting amplifier.

20. The converter of claim 18 wherein a gain of said delay cell and summer circuit is implemented as the ratio of capacitor values of said first capacitor and said second capacitor within said delay cell and summer circuit.

21. The converter of claim 18 further comprising:

at least one feed-forward gain circuit, one feed-forward gain circuit coupled between each pair of sequential loops, each feed-forward gain circuit comprising at least two signal paths, each signal path comprising:

a first switch;

a capacitor coupled to said first switch;

a second switch coupled to said first capacitor and said AC ground; and a third switch coupled to said second switch and said AC ground.

22. The converter of claim 21 wherein a gain of said feed-forward gain element is implemented as the ratio of capacitor values of said capacitor within said feed-forward gain circuit and said second capacitor within said delay cell and summer circuit to which said feed-forward gain circuit couples.

23. The converter of claim 18 wherein capacitor values of said capacitors within said delay cell and summer circuits are selected based on a noise calculation.

24. A sigma-delta analog-to-digital converter comprising:

a plurality of loops coupled in cascade, wherein each loop includes a quantizer implemented with two comparators, wherein one comparator is clocked by a switching clock having a first phase and another comparator is clocked by a switching clock having a second phase, and wherein said comparators provide differential outputs;

at least one feed-forward gain element, one gain element coupled between each pair of sequential loops; and a noise cancellation logic coupled to each of said plurality of loop, said noise cancellation logic providing a converter output.

25. A bandpass sigma-delta analog-to-digital converter comprising:

two or more loops coupled in cascade, each loop including a plurality of discrete delay elements;

a feed-forward gain element, one gain element coupled between each pair of adjacent loops; and a noise cancellation logic coupled to each loop, said noise cancellation logic providing a converter output.

26. A sigma-delta analog-to-digital converter comprising:

two or more loops coupled in cascade; and at least one feed-forward gain element, one feed-forward gain element coupled between each pair of sequential loops, wherein a bias current of at least one of said two or more loops can be adjusted based on a required dynamic range.

27. A sigma-delta analog-to-digital converter comprising:

two or more loops coupled in cascade; and at least one feed-forward gain element, one feed-forward gain element coupled between each pair of sequential loops, wherein at least one of said two or more loops can be disabled based on a required dynamic range.

28. The converter of claim 24 further comprising:

a noise cancellation logic coupled to each of said two or more loops, said noise cancellation logic providing a converter output.

29. The converter of claim 24 wherein each loop is implemented with multi-sampling circuitry that samples a respective loop input signal at multiple phases of a clock signal.

30. The converter of claim 24 wherein each loop is implemented with double-sampling circuitry that samples a respective loop input signal at alternative phases of a clock signal.

31. The converter of claim 24 wherein each loop is implemented with switched capacitor circuits or switched current circuits.

32. The converter of claim 26 wherein said two or more loops are configured as a MASH architecture.

33. The converter of claim 24 wherein said two or more loops are configured to provide bandpass sampling of a converter input signal.

34. A bandpass sigma-delta analog-to-digital converter comprising:
- two or more loops coupled in cascade, wherein each loop is implemented with two or more interleaved high-pass signal paths; and
- a feed-forward gain element, one feed-forward gain element coupled between each pair of sequential loops.

35. The bandpass converter of claim 34 further comprising:
- a noise cancellation logic coupled to each loop, said noise cancellation logic combining outputs from said interleaved high-pass signal paths to provide a converter output.

36. The bandpass converter of claim 34 wherein said interleaved high-pass signal paths of each loop are clocked at different phases of a clock signal.

37. The bandpass converter of claim 34 wherein each interleaved high-pass signal path is implemented using at least one delay element.

38. A sigma-delta analog-to-digital converter comprising:
- a plurality of loops coupled in cascade, each loop including at least one filter section, wherein each filter section is implemented with multi-sampling circuitry that samples a respective filter input signal at multiple phases of a clock signal; and
- at least one feed-forward gain element, one gain element coupled between each pair of sequential loops.

39. The converter of claim 38 wherein said multi-sampling circuitry for each loop includes multiple signal paths, wherein each signal path is clocked by a set of clock signals having clock phases unique from those of other signal paths.

40. The converter of claim 38 wherein said multi-sampling circuitry for each loop includes two signal paths clocked at alternative phases of the clock signal.

* * * * *